(12) United States Patent
Mitsumoto et al.

(10) Patent No.: US 7,745,090 B2
(45) Date of Patent: Jun. 29, 2010

(54) PRODUCTION METHOD OF LITHOGRAPHIC PRINTING PLATE, LITHOGRAPHIC PRINTING PLATE PRECURSOR AND LITHOGRAPHIC PRINTING METHOD

(75) Inventors: Tomoyoshi Mitsumoto, Shzizuoka (JP); Toshifumi Inno, Shzizuoka (JP)

(73) Assignee: Fujifilm Corporation, Tokyo (JP)

( * ) Notice: Subject to any disclaimer, the term of this patent is extended or adjusted under 35 U.S.C. 154(b) by 105 days.

(21) Appl. No.: 11/209,798

(22) Filed: Aug. 24, 2005

(65) Prior Publication Data

US 2006/0046199 A1 Mar. 2, 2006

(30) Foreign Application Priority Data

Aug. 24, 2004 (JP) ............................ P.2004-243889
Sep. 9, 2004 (JP) ............................ P.2004-262529

(51) Int. Cl.
*B41F 7/00* (2006.01)
*B41N 1/00* (2006.01)
*G03C 1/00* (2006.01)
*G03C 1/72* (2006.01)
*G03F 7/00* (2006.01)
*G03F 7/26* (2006.01)

(52) U.S. Cl. ............... 430/270.1; 430/138; 430/271.1; 430/281.1; 430/300; 430/302; 101/450.1; 101/453

(58) Field of Classification Search ................ 430/138, 430/270.1, 273.1, 281.1, 286.1, 288.1, 302, 430/309, 434, 435, 494, 271.1, 300
See application file for complete search history.

(56) References Cited

U.S. PATENT DOCUMENTS 5,506,090 A * 4/1996 Gardner et al. .............. 430/302

(Continued)

FOREIGN PATENT DOCUMENTS

EP 1 329 311 A1 7/2003

(Continued)

*Primary Examiner*—Cynthia H Kelly
*Assistant Examiner*—Chanceity N Robinson
(74) *Attorney, Agent, or Firm*—Birch, Stewart, Kolasch & Birch, LLP

(57) ABSTRACT

A method for producing a lithographic printing plate is provided, wherein, in the non-alkaline development of a lithographic printing plate precursor having a protective layer, even if the protective layer components are mingled into the developer, the reduction in development removability of the image recording layer and the generation of development scum can be inhibited; an on-press development type lithographic printing plate precursor with excellent inking property, high scratch resistance, satisfied on-press developability and good fine line reproducibility is provided; and a lithographic printing method is provided, each of which is a method for producing a lithographic printing plate, comprising: imagewise exposing a lithographic printing plate precursor comprising a support, an image recording layer and a protective layer, and rubbing the plate surface by a rubbing member of an automatic processor in the presence of a developer at a pH of 2 to 10 to remove the protective layer and the image recording layer in the unexposed area; a lithographic printing plate precursor comprising a support, an image recording layer removable with a printing ink and/or a fountain solution, and a protective layer containing a polyvinyl alcohol having a carboxyl group and/or a sulfonic acid group within the molecule; and a lithographic printing method comprising on-press development.

7 Claims, 1 Drawing Sheet

U.S. PATENT DOCUMENTS

| | | | |
|---|---|---|---|
| 5,582,952 A * | 12/1996 | Kawamura et al. | 430/166 |
| 6,395,459 B1 * | 5/2002 | Taylor et al. | 430/434 |
| 6,417,137 B1 * | 7/2002 | Suzaki et al. | 503/200 |
| 6,890,698 B2 * | 5/2005 | Naruse et al. | 430/270.1 |
| 6,946,425 B2 * | 9/2005 | Yamamoto et al. | 503/227 |
| 2003/0164105 A1 * | 9/2003 | Tashiro | 101/453 |
| 2003/0165777 A1 * | 9/2003 | Teng | 430/292 |
| 2003/0198893 A1 * | 10/2003 | Oshima | 430/273.1 |
| 2004/0013968 A1 | 1/2004 | Teng | |
| 2004/0131974 A1 | 7/2004 | Suzuki | |
| 2004/0154488 A1 * | 8/2004 | Tomita et al. | 101/458 |
| 2005/0069811 A1 * | 3/2005 | Mitsumoto et al. | 430/270.1 |
| 2006/0046185 A1 * | 3/2006 | Goto | 430/270.1 |

FOREIGN PATENT DOCUMENTS

| | | |
|---|---|---|
| EP | 1 356 929 A2 | 10/2003 |
| EP | 1356929 A2 * | 10/2003 |
| EP | 1 518 672 A2 * | 3/2005 |
| JP | 11-38633 A | 2/1999 |
| JP | 2938397 A | 6/1999 |
| JP | 2000-39711 A | 2/2000 |
| JP | 2001-277740 A | 10/2001 |
| JP | 2001-277742 A | 10/2001 |
| JP | 2002-287334 A | 10/2002 |
| JP | 2002-365789 A | 12/2002 |

* cited by examiner

PRODUCTION METHOD OF LITHOGRAPHIC PRINTING PLATE, LITHOGRAPHIC PRINTING PLATE PRECURSOR AND LITHOGRAPHIC PRINTING METHOD

BACKGROUND OF THE INVENTION

1. Field of the Invention

The present invention relates to a method for producing a lithographic printing plate and also relates to a lithographic printing plate precursor and a lithographic printing method. More specifically, the present invention relates to a method for producing a lithographic printing plate by removing, after exposure, the unexposed area of the image recording layer with use of a developer at a pH of 2 to 10 in an automatic processor, and also relates to an on-press development type lithographic printing plate precursor and a lithographic printing method.

2. Background Art

The lithographic printing plate in general consists of a lipophilic image area of receiving an ink and a hydrophilic non-image area of receiving a fountain solution in the printing process. The lithographic printing is a printing method utilizing the repellency between water and oily ink from each other, where the lipophilic image area and the hydrophilic non-image area of the lithographic printing plate are formed as an ink-receiving part and a fountain solution-receiving part (ink non-receiving part), respectively, to cause difference in the ink adhesion on the surface of the lithographic printing plate, an ink is attached only to the image area and thereafter, the ink is transferred to a material on which the image is printed, such as paper, thereby performing printing.

For producing this lithographic printing plate, a lithographic printing plate precursor (PS plate) comprising a hydrophilic support having provided thereon a lipophilic photosensitive resin layer (image recording layer) has been heretofore widely used. Usually, a lithographic printing plate is obtained by a plate-making method where the lithographic printing plate precursor is exposed through an original image such as lith film and while leaving the image recording layer working out to the image area, the other unnecessary image recording layer is dissolved and removed with an alkaline developer or an organic solvent to reveal the hydrophilic support surface, thereby forming a non-image area.

In the plate-making process using a conventional lithographic printing plate precursor, a step of dissolving and removing the unnecessary image recording layer with a developer or the like must be provided after exposure but as one problem to be solved, it is demanded to simplify such an additive wet processing. As one technique for the simplification, capability of development with an aqueous solution close to neutral or with mere water is demanded.

On the other hand, a digitization technique of electronically processing, storing and outputting image information by using a computer has been recently widespread and various new image-output systems coping with such a digitization technique have been put into practical use. Along with this, a computer-to-plate technique is attracting attention, where digitized image information is carried on a highly converging radiant ray such as laser light and a lithographic printing plate precursor is scan-exposed by this light to directly produce a lithographic printing plate without the intervention of a lith film. Accordingly, one of important technical problems to be solved is to obtain a lithographic printing plate precursor suitable for such a technique.

Under these circumstances, the demand for plate-making work satisfying both simplification and digitization is ever-stronger at present.

For example, Patent Document 1 (JP-A-2002-365789 (the term "JP-A" as used herein means an "unexamined published Japanese patent application")) describes a lithographic printing plate precursor comprising a hydrophilic support having thereon an image forming layer containing a hydrophobization precursor, a hydrophilic resin and a light-to-heat converting agent, wherein the image forming layer further contains a compound having an ethylene oxide chain, so that on-press development and also after exposure and liquid development with a developer which is water or an appropriate aqueous solution, printing can be performed.

Patent Document 2 (U.S. 2004/0013968) describes a method for processing a lithographic printing plate precursor, wherein a lithographic printing plate precursor comprising (i) a hydrophilic support and (ii) a lipophilic thermosensitive layer containing a radical polymerizable ethylenically unsaturated monomer, a radical polymerization initiator and an infrared absorbing dye, which is cured by exposure with an infrared laser and can be developed with an aqueous developer containing 60 mass % or more or water and having a pH of 2.0 to 10.0, is prepared and imagewise exposed with an infrared laser, and the uncured region of the thermosensitive layer is removed with an aqueous developer.

On the other hand, in a lithographic printing plate precursor utilizing a polymerization reaction, a protective layer (overcoat layer) is usually provided so as to block oxygen which inhibits the polymerization reaction, or prevent scratching of the image recording layer or ablation at the exposure with a high-intensity laser. Here, in the protective layer, a water-soluble polymer compound with excellent crystallinity, such as polyvinyl alcohol, has been heretofore used as the main component. Also, Patent Document 3 (JP-A-11-38633) describes a radical polymerization-type lithographic printing plate precursor comprising a protective layer containing an inorganic layered compound such as mica and states that this lithographic printing plate precursor ensures high sensitivity and good storage stability and can be developed with an aqueous alkali solution.

As another simple and easy plate-making method, a method called on-press development has been proposed, where an image recording layer allowing for removal of the unnecessary portion of the image recording layer during a normal printing process is used and after exposure, the unnecessary portion of the image recording layer is removed on a printing press to obtain a lithographic printing plate.

Specific examples of the on-press development method include a method using a lithographic printing plate precursor having an image recording layer dissolvable or dispersible in a fountain solution, an ink solvent or an emulsified product of fountain solution and ink, a method of mechanically removing the image recording layer by the contact with rollers or a blanket cylinder of a printing press, and a method of weakening the cohesion of the image recording layer or adhesion between the image recording layer and the support by the impregnation of a fountain solution, an ink solvent or the like and then mechanically removing the image recording layer by the contact with rollers or a blanket cylinder.

For example, Patent Document 4 (Japanese Patent 2,938,397) describes a lithographic printing plate precursor where an image forming layer comprising a hydrophilic binder having dispersed therein hydrophobic thermoplastic polymer particles is provided on a hydrophilic support. In Patent Document 4, it is stated that after this lithographic printing plate precursor is exposed with an infrared laser to cause thermal coalescence of hydrophobic thermoplastic polymer particles and thereby form an image, the printing plate precursor can be loaded on a cylinder of a printing press and then on-press developed by supplying a fountain solution and/or ink.

Such a method of forming an image through coalescence by mere heat fusion of fine particles has a problem that despite good on-press developability, the image strength is extremely low and the press life is insufficient.

For solving these problems, a technique of improving the press life by utilizing a polymerization reaction has been studied. For example, Patent Documents 5 and 6 (JP-A-2001-277740 and JP-A-2001-277742, respectively) describe a lithographic printing plate precursor comprising a hydrophilic support having thereon a layer containing a polymerizable compound-enclosing microcapsule. Also, Patent Document 7 (JP-A-2002-287334) describes a lithographic printing plate precursor comprising a support having provided thereon a photosensitive layer containing an infrared absorbent, a radical polymerization initiator and a polymerizable compound. Furthermore, Patent Document 8 (JP-A-2000-39711) describes a lithographic printing plate precursor which can be on-press developed after exposure, the printing plate precursor comprising an aluminum support having thereon a layer comprising a photosensitive composition containing (a) a water-soluble or water-dispersible polymer, (b) a monomer or oligomer having a photopolymerizable ethylenically unsaturated double bond and (c) a photopolymerization initiation system having absorption maximum in the ultraviolet region.

In the case of developing a negative lithographic printing plate precursor having a protective layer, the image recording layer in the unexposed area and also the protective layer must be removed by the development. However, if the image recording layer in the unexposed area and the protective layer are removed at the same time, the protective layer components dissolved in the developer may cause a problem such as reduction in the activity of developer or generation of scum in the developer.

In order to solve this problem, in the case of a conventional image recording layer developable with an alkaline developer, it may be possible to previously remove the protective layer by water washing and then remove the image recording layer in the unexposed area by development, but when a non-alkaline developer preferred in view of working safety is used, the protective layer as well as the unexposed area of the image recording layer are removed by water washing and it is difficult to separately perform the removal of protective layer and the development of image recording layer.

Furthermore, in the on-press development type lithographic printing plate precursor, a protective layer is usually provided on the image recording layer so as to prevent scratching or staining of the image recording layer, block oxygen or prevent ablation at the exposure with a high-intensity laser, and in the protective layer, a water-soluble polymer compound with excellent crystallinity, such as polyvinyl alcohol, has been heretofore used as the main component. The water-soluble polymer compound with excellent crystallinity readily remains due to its low dissolution rate in the fountain solution and this disadvantageously deteriorates the inking property or on-press developability. Also, the fine line reproducibility is still insufficient.

SUMMARY OF THE INVENTION

The present invention has been made to solve these problems. That is, an object of the present invention is to provide a method for producing a lithographic printing plate, where in the development of a lithographic printing plate precursor having a protective layer and being capable of non-alkaline development, even if the protective layer components are mingled into the developer, the reduction in development removability of the image recording layer and the generation of development scum can be inhibited. Another object of the present invention is to provide an on-press development type lithographic printing plate precursor with excellent inking property, high scratch resistance, satisfied on-press developability and good fine line reproducibility, and a lithographic printing method using the lithographic printing plate precursor.

As a result of intensive investigations, the present inventors have succeeded in solving those problems in the development processing and on-press development of a lithographic printing plate precursor. That is, the present invention is as follows.

1. A method for producing a lithographic printing plate, comprising:
imagewise exposing a lithographic printing plate precursor comprising a support, an image recording layer and a protective layer, in this order, to cure the image recording layer in the exposed area; and then,
rubbing the plate surface by a rubbing member in an automatic processor in the presence of a developer at a pH of 2 to 10 to remove the image recording layer in the unexposed area and the protective layer.

2. The method for producing a lithographic printing plate as described in the item 1, wherein the rubbing member is a rotating brush roller.

3. A method for producing a lithographic printing plate, comprising:
imagewise exposing a lithographic printing plate precursor comprising a support, an image recording layer and a protective layer in this order, to cure the image recording layer in the exposed area, in which the protective layer contains an inorganic layered compound; and then
rubbing the plate surface by a rubbing member in the presence of a developer at a pH of 2 to 10 to remove the image recording layer in the unexposed area and the protective layer.

4. A method for producing a lithographic printing plate, comprising:
imagewise exposing a lithographic printing plate precursor comprising a support, an image recording layer and a protective layer in this order, to cure the image recording layer in the exposed area, in which the protective layer has a dry coated weight of 0.05 to 0.5 g/m$^2$; and then
rubbing the plate surface by a rubbing member in the presence of a developer at a pH of 2 to 10 to remove the image recording layer in the unexposed area and the protective layer.

5. The method for producing a lithographic printing plate as described in the item 4, wherein said protective layer contains an inorganic layered compound.

6. The method for producing a lithographic printing plate as described in any one of the items 1 to 5, wherein the pH of the developer is from 3 to 9.

7. The method for producing a lithographic printing plate as described in any one of the items 1 to 6, wherein the image recording layer contains (1) a polymerization initiator, (2) a polymerizable compound and (3) a hydrophobic binder polymer.

8. The method for producing a lithographic printing plate as described in the item 7, wherein a part or all of said image recording layer components are enclosed in a microcapsule or microgel.

9. The method for producing a lithographic printing plate as described in any one of the items 1 to 8, wherein said imagewise exposure is performed by using a laser of emitting light at any one wavelength in the range from 760 to 1,200 nm.

10. The method for producing a lithographic printing plate as described in any one of the items 1 to 8, wherein said imagewise exposure is performed by using a laser of emitting light at any one wavelength in the range from 250 to 420 nm.

11. A lithographic printing plate precursor comprising a support, an image recording layer and a protective layer in this order, wherein the image recording layer is removable with a printing ink and/or a fountain solution, and the protective layer contains a polyvinyl alcohol having at least one of a carboxyl group and a sulfonic acid group within the molecule.

12. The lithographic printing plate precursor as described in the item 11, wherein the protective layer further contains an inorganic layered compound.

13. The lithographic printing plate precursor as described in the item 11 or 12, wherein the acid modification ratio of said polyvinyl alcohol is from 3 to 8%.

14. The lithographic printing plate precursor as described in any one of the items 11 to 13, wherein the image recording layer comprises a microcapsule or a microgel.

15. A lithographic printing method comprising: imagewise exposing the lithographic printing plate precursor described in any one of the items 11 to 14 by the irradiation of an infrared ray at a wavelength of 760 to 1,200 nm; supplying a printing ink and a fountain solution to remove said image recording layer in the portion unirradiated with the infrared ray; and performing printing.

16. A lithographic printing method comprising: imagewise exposing the lithographic printing plate precursor described in any one of the items 11 to 14 by the irradiation of an ultraviolet ray at a wavelength of 250 to 420 nm; supplying a printing ink and a fountain solution to remove said image recording layer in the portion unirradiated with the ultraviolet ray; and performing printing.

According to the present invention, a method for producing a lithographic printing plate can be provided, where in the development processing of a lithographic printing plate precursor having a protective layer and being capable of non-alkaline development, even if the protective layer is mingled into the developer, the reduction in development removability of the image recording layer and the generation of development scum can be inhibited. Furthermore, according to the present invention, a lithographic printing plate precursor with excellent inking property, high scratch resistance, satisfied on-press developability and good fine line reproducibility, and a lithographic printing method using the lithographic printing plate precursor can be provided.

Figure 1:
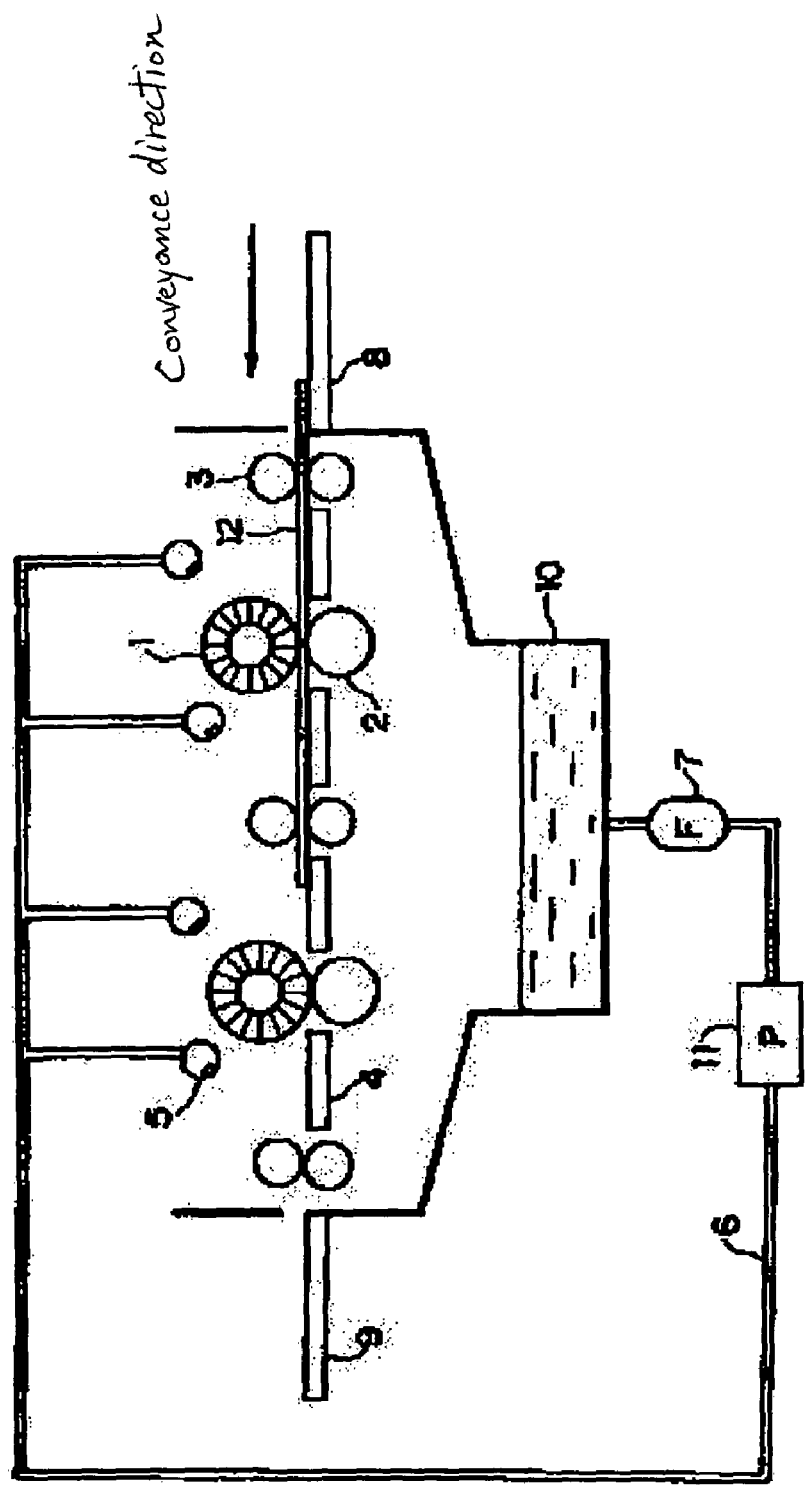
FIG. 1 shows a structure of an automatic development processor.

| Description of Numerical References | |
|---|---|
| 1: | Rotating brush roller |
| 2: | Backing roller |
| 3: | Conveyance roller |
| 4: | Conveyance guide plate |
| 5: | Spray pipe |
| 6: | Pipe line |
| 7: | Filter |
| 8: | Plate supply table |

| Description of Numerical References | |
|---|---|
| 9: | Plate discharge table |
| 10: | Developer tank |
| 11: | Circulating pump |
| 12: | Plate |

DETAILED DESCRIPTION OF THE INVENTION

1. Lithographic Printing Plate Precursor for Processing by Automatic Developing Machine A lithographic printing plate precursor for use in the method for producing a lithographic printing plate, where after imagewise exposure, the protective layer and the image recording layer in the unexposed area are removed by an automatic processor equipped with a rubbing member, is descried below.

[Protective Layer]

In the lithographic printing plate precursor capable of non-alkaline development of the present invention, the protective layer preferably contains an inorganic layered compound. The inorganic layered compound as used herein means a particle having a thin plate-like shape, and examples thereof include a mica family (e.g., natural mica, synthetic mica) represented by the following formula:

$$A(B,C)_{2-5}D_4O_{10}(OH,F,O)_2$$

[wherein A is K, Na or Ca, B and C each is Fe(II), Fe(III), Mn, Al, Mg or V, and D is Si or Al], a talc represented by the formula: $3MgO.4SiO.H_2O$, taeniolite, montmorillonite, saponite, hectorite and zirconium phosphate.

Out of the mica family, examples of the natural mica include muscovite, paragonite, phlogopite, biotite and lepidolite. Examples of the synthetic mica include non-swelling mica such as fluorophlogopite $KMg_3(AlSi_3O_{10})F_2$ and potassium tetrasilicic mica, and swelling mica such as Na-tetrasilicic mica $NaMg_{2.5}(Si_4O_{10})F_2$, Na- or Li-taeniolite (Na, Li)$Mg_2Li(Si_4O_{10})F_2$, and montmorillonite-based Na- or Li-hectorite (Na, Li)$_{1/8}Mg_{2/5}Li_{1/8}(Si_4O_{10})F_2$. Synthetic smectite is also useful.

In the present invention, among these inorganic layered compounds, fluorine-based swelling micas which are a synthetic inorganic layered compound are particularly useful. These swelling synthetic micas and the swelling clay minerals such as montmorillonite, saponite, hectorite and bentonite have a layered structure comprising unit crystalline lattice layers having a thickness of approximately from 10 to 15 Å, and the intra-lattice metallic atom substitution is considerably larger than that of other clay minerals. As a result, the lattice layer causes shortage in positive electric charge, and a cation such as $Na^+$, $Ca^{2+}$ and $Mg^{2+}$ is adsorbed between layers to compensate for the shortage. The cation intervening between these layers is called an exchangeable cation and is exchanged with various cations. Particularly, in the case where the cation between layers is $Li^+$ or $Na^+$, the bonding between layered crystalline lattices is weak due to small ionic radius, and great swelling with water occurs. When shearing is applied in this state, cleavage readily results and a stable sol is formed in water. This tendency is outstanding in bentonite and swelling synthetic mica, and these are useful in the present invention. In particular, swelling synthetic mica is preferred.

As for the shape of the inorganic layered compound for use in the present invention, the thickness is preferably as small as possible from the standpoint of controlling the dispersion, and the plane size is preferably as large as possible as long as the flatness of coated surface and the transparency to active light are not impaired. Therefore, the aspect ratio is 20 or more, preferably 100 or more, more preferably 200 or more. The aspect ratio is a ratio of thickness to long diameter of a particle and can be measured, for example, from a projection view by a microphotograph of particles.

The particle size of the inorganic layered compound for use in the present invention is, in terms of average long diameter, from 0.3 to 20 μm, preferably from 0.5 to 10 μm, more preferably from 1 to 5 μm. The average thickness of the particle is 0.1 μm or less, preferably 0.05 μm or less, more preferably 0.01 μm or less. For example, out of inorganic layered compounds, the swelling synthetic mica as a representative compound has a size such that the thickness is from 1 to 50 nm and the plane size is approximately from 1 to 20 μm.

When such an inorganic layered compound particle having a large aspect ratio is incorporated into the protective layer, the coating strength is increased and the permeation of oxygen or water content can be effectively inhibited, so that the protective layer can be prevented from deterioration due to deformation and even when stored for a long time under high-humidity condition, the lithographic printing plate precursor can be free of reduction in the image formability due to change of humidity and exhibit excellent storage stability.

The content of the inorganic layered compound in the protective layer is preferably from 5/1 to 1/00 in terms of the mass ratio to the amount of binder used in the protective layer. Even when a plurality of inorganic layered compounds are used in combination, the total amount of these inorganic layered compounds preferably accounts for a mass ratio within the above-described range.

In the present invention, the exposure is usually performed in air and the protective layer prevents low molecular compounds such as oxygen and basic substance present in air, which inhibit the image-forming reaction occurring upon exposure in the image recording layer, from mingling into the image recording layer and thereby prevents the inhibition of image-forming reaction at the exposure in air. Accordingly, the property required of the protective layer is low permeability to low molecular compounds such as oxygen. Furthermore, the protective layer preferably has good transparency to light used for exposure, excellent adhesion to the image recording layer, and easy removability during on-press development after exposure. Various studies have been heretofore made on the protective layer having such properties, and these are described in detail, for example, in U.S. Pat. No. 3,458, 311 and JP-B-55-49729 (the term "JP-B" as used herein means an "examined Japanese patent publication").

In the protective layer, a binder is preferably used together with the inorganic layered compound.

The binder is not particularly limited as long as the inorganic layered particle has good dispersibility therein and a uniform film adhering to the image recording layer can be formed, and either a water-soluble polymer or a water-insoluble polymer may be appropriately selected and used. Specific examples of the binder include a water-soluble polymer such as polyvinyl alcohol, modified polyvinyl alcohol, polyvinylpyrrolidone, polyacrylic acid, polyacrylamide, partially saponified polyvinyl acetate, ethylene-vinyl alcohol copolymer, water-soluble cellulose derivative, gelatin, starch derivative and gum arabic, and a water-insoluble polymer such as polyvinylidene chloride, poly(meth)acrylonitrile, polysulfone, polyvinyl chloride, polyethylene, polycarbonate, polystyrene, polyamide and cellophane. These polymers may also be used in combination of two or more thereof, if desired.

Particularly, in view of easy removability of the protective layer remaining in the non-image area and handleability at the film formation, a water-soluble polymer is preferred and, for example, polyvinyl alcohol, polyvinylpyrrolidone, polyvinylimidazole, water-soluble acrylic resin (e.g., polyacrylic acid), gelatin and gum arabic are preferred. Among these, polyvinyl alcohol, polyvinylpyrrolidone, gelatin and gum arabic are more preferred, because such a polymer can be coated by using water as the solvent and can be easily removed by a fountain solution at the printing.

A part of the polyvinyl alcohol usable for the protective layer of the present invention may be replaced by an ester, an ether or an acetal or may have another copolymerization component as long as the polyvinyl alcohol contains an unsubstituted vinyl alcohol unit in a substantial amount for giving necessary water solubility. Examples of the polyvinyl alcohol include those having a hydrolysis degree of 71 to 100% and a polymerization degree of 300 to 2,400.

Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd. Examples of the copolymer include chloroacetate or propionate of polyvinyl acetate having a hydrolysis degree of 88 to 100 mol %, polyvinyl formal, polyvinyl acetal, and a copolymer thereof Also, known modified polyvinyl alcohols can be preferably used. Examples thereof include polyvinyl alcohols with various polymerization degrees having randomly various hydrophilic modified moieties such as anion-modified moiety (modified with anion such as carboxyl group and sulfo group), cation-modified moiety (modified with cation such as amino group and ammonium group), silanol-modified moiety and thiol-modified moiety, and polyvinyl alcohols with various polymerization degrees having, at the polymer chain terminal, various modified moieties such as anion-modified moiety described above, cation-modified moiety described above, silanol-modified moiety, thiol-modified moiety, alkoxyl-modified moiety, sulfide-modified moiety, moiety modified with an ester of vinyl alcohol and various organic acid, moiety modified with an ester of the above-described anion-modified moiety and alcohols, and epoxy-modified moiety.

A general dispersion method for the inorganic layered compound used in the protective layer is described below. From 5 to 10 parts by mass of the swelling layered compound described above as a preferred inorganic layered compound is added to 100 parts by mass of water, thoroughly blended and swelled with water, and then dispersed by a dispersing machine. Examples of the dispersing machine used here include various mills of dispersing the layered compound by directly applying mechanical force, a high-speed agitation-type dispersing machine having large shearing force, and a dispersing machine of giving highly intensified ultrasonic energy. Specific examples thereof include a ball mill, a sand grinder mill, a visco-mill, a colloid mill, a homogenizer, a dissolver, a polytron, a homomixer, a homoblender, a KD mill, a jet agitator, a capillary emulsifier, a liquid siren, an electromagnetic strain-type ultrasonic generator, and an emulsifier with Pullman's whistle. A dispersion containing from 5 to 10 mass % of the inorganic layered compound dispersed by the above-described method is in a highly viscous or gelled state, and its storage stability is extremely good. At the time of preparing a protective layer coating solution by using this dispersion, the dispersion is preferably diluted with water, thoroughly stirred and blended with a binder solution.

In the protective layer coating solution, known additives such as surfactant for enhancing the coatability and water-soluble plasticizer for improving the physical properties of film can be added in addition to the inorganic layered compound. Examples of the water-soluble plasticizer include propionamide, cyclohexanediol, glycerin and sorbitol. A water-soluble (meth)acrylic polymer may also be added. Furthermore, in this coating solution, known additives for enhancing adhesion to the image recording layer and aging stability of the coating solution may also be added.

The protective layer coating solution prepared in this way is coated on the image recording layer provided on the support, and then dried to form a protective layer. The coating solvent may be appropriately selected according to the binder but when a water-soluble polymer is used, distilled water or purified water is preferably used as the solvent. The coating method of the protective layer is not particularly limited, and known methods such as method described in U.S. Pat. No. 3,458,311 and JP-B-55-49729 may be applied. Specific examples of the coating method for the protective layer include a blade coating method, an air knife coating method, a gravure coating method, a roll coating method, a spray coating method, a dip coating method and a bar coating method.

The coated amount of the protective layer is, in terms of the coated amount after drying, preferably from 0.05 to 0.5 g/m$^2$, more preferably from 0.1 to 0.3 g/m$^2$. Within this range, the effect on the developer is decreased and various performances such as oxygen blocking or surface protection of the image recording layer can be satisfied.

[Image Recording Layer]

The lithographic printing plate precursor for use in the plate-making method of the present invention has a negative image recording layer where the image recording layer in the exposed area is cured. The negative image recording layer is not particularly limited, but a radical polymerizable image recording layer containing a hydrophobic binder polymer, a polymerization initiator and a polymerizable compound is preferred, because easy developability and good press life are obtained. The constituent components of the image recording layer are described below.

<Hydrophobic Binder Polymer>

The hydrophobic binder polymer which can be used in the image recording layer of the present invention is preferably a water-insoluble polymer. Furthermore, the hydrophobic binder polymer usable in the present invention preferably contains substantially no acid group such as carboxyl group, sulfone group and phosphoric acid group. That is, the hydrophobic binder polymer usable in the present invention is preferably insoluble in water or an aqueous solution at a pH of 10 or more, and the solubility of the hydrophobic binder polymer in water or an aqueous solution at a pH of 10 or more is preferably 0.5 mass % or less, more preferably 0.1 mass % or less. By using such a hydrophobic binder polymer, the film strength, water resistance and inking property of the image recording layer are elevated and an enhanced press life can be obtained.

As for the hydrophobic binder polymer, conventionally known hydrophobic binder polymers preferably having a solubility in the above-described range can be used without limitation as long as the performance of the lithographic printing plate of the present invention is not impaired, and a linear organic polymer having film property is preferred.

Preferred examples of such a hydrophobic binder polymer include a polymer selected from acrylic resin, polyvinyl acetal resin, polyurethane resin, polyamide resin, epoxy resin, methacrylic resin, styrene-based resin and polyester resin. Among these, acrylic resin is preferred, and a (meth) acrylic acid ester copolymer is more preferred. More specifically, a copolymer of a (meth)acrylic acid alkyl or aralkyl ester with a (meth)acrylic acid ester containing a —$CH_2CH_2O$— or —$CH_2CH_2NH$— unit in R of the ester residue (—COOR) of the (meth)acrylic acid ester is particularly preferred. The alkyl group in the (meth)acrylic acid alkyl ester is preferably an alkyl group having from 1 to 5 carbon atoms, more preferably a methyl group. Preferred examples of the (meth)acrylic acid aralkyl ester include benzyl (meth) acrylate.

The hydrophobic binder polymer may be imparted with a crosslinking property so as to enhance the film strength in the image area. The crosslinking property may be imparted to the hydrophobic binder polymer by introducing a crosslinking functional group such as ethylenically unsaturated bond into the polymer. The crosslinking functional group may be introduced by copolymerization. Examples of the hydrophobic binder polymer having an ethylenically unsaturated bond within the molecule include polymers which are a polymer of acrylic or methacrylic acid ester or amide and in which the ester or amide residue (R' in —COOR' or —CONHR') has an ethylenically unsaturated bond.

Examples of the residue (R' above) having an ethylenically unsaturated bond include —$(CH_2)_nCR^1$=$CR^2R^3$, —$(CH_2O)_n$ $CH_2CR^1$=$CR^2R^3$, —$(CH_2CH_2O)_n$ $CH_2CR^1$=$CR^2R^3$, —$(CH_2)_nNH$—CO—O—$CH_2CR^1$=$CR^2R^3$, —$(CH_2)_n$—O—CO—$CR^1$=$CR^2R^3$ and —$(CH_2CH_2O)_2$—X (wherein $R^1$ to $R^3$ each represents a hydrogen atom, a halogen atom or an alkyl, aryl, alkoxy or aryloxy group having from 1 to 20 carbon atoms, $R^1$ and $R^2$ or $R^3$ may combine with each other to form a ring, n represents an integer of 1 to 10, and X represents a dicyclopentadienyl residue).

Specific examples of the ester residue include —$CH_2CH$=$CH_2$ (described in JP-B-7-21633), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$ and —$CH_2CH_2O$—X (wherein X represents a dicyclopentadienyl residue).

Specific examples of the amide residue include —$CH_2CH$=$CH_2$, —$CH_2CH_2$—Y (wherein Y represents a cyclohexene residue) and —$CH_2CH_2$—OCO—$CH$=$CH_2$.

In the hydrophobic binder polymer having a crosslinking property, for example, a free radical (a polymerization initiating radical or a radical grown in the process of polymerization of a polymerizable compound) is added to the crosslinking functional group to cause an addition-polymerization between polymers directly or through a polymerization chain of the polymerizable compound, as a result, crosslinking is formed between polymer molecules and thereby curing is effected. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between polymer molecules, thereby effecting curing.

The content of the crosslinking group (content of radical-polymerizable unsaturated double bond determined by iodine titration) in the binder polymer is preferably from 0.1 to 10.0 mmol, more preferably from 1.0 to 7.0 mmol, and most preferably from 2.0 to 5.5 mmol, per g of the hydrophobic binder polymer.

In view of enhancing the developability with an aqueous solution, the binder polymer is preferably hydrophilic. On the other hand, in view of enhancing the press life, it is important that the binder polymer has good compatibility with the polymerizable compound contained in the image recording layer, that is, the binder polymer is preferably lipophilic. From these aspects, it is also effective in the present invention to copolymerize a hydrophilic group and a lipophilic group in the hydrophobic binder polymer and thereby enhance the developability and the press life. Examples of the hydrophilic group which can be suitably used include those having a hydrophilic group such as hydroxy group, carboxylate group, hydroxyethyl group, ethyleneoxy group, hydroxypropyl group, polyoxyethyl group, polyoxypropyl group, amino group, aminoethyl group, aminopropyl group, ammonium group, amide group and carboxymethyl group.

The hydrophobic binder polymer preferably has a mass average molecular weight of 5,000 or more, more preferably from 10,000 to 300,000, and a number average molecular weight of 1,000 or more, more preferably from 2,000 to 250,000. The polydispersity (mass average molecular weight/number average molecular weight) is preferably from 1.1 to 10.

The hydrophobic binder polymer may be a random polymer, a block polymer, a graft polymer or the like but is preferably a random polymer.

The hydrophobic binder polymers may be used individually or in combination of two or more thereof.

The content of the hydrophobic binder polymer is from 5 to 90 mass %, preferably from 10 to 70 mass %, more preferably from 10 to 60 mass %, based on the entire solid content of the image recording layer. Within this range, good strength of image area and good image-forming property can be obtained.

<Polymerization Initiator>

The polymerization initiator for use in the present invention is a compound of generating a radical by the effect of light or heat energy and thereby initiating or accelerating the polymerization of a compound having a polymerizable unsaturated group. The radical generator used here may be appropriately selected from, for example, known polymerization initiators and compounds having a bond with small bond-dissociation energy.

Examples of the compound of generating a radical include an organohalogen compound, a carbonyl compound, an organoperoxide, an azo-based compound, an azide compound, a metallocene compound, a hexaarylbiimidazole compound, an organoboron compound, a disulfone compound, an oxime ester compound and an onium salt compound.

Specific examples of the organohalogen compound include the compounds described in Wakabayashi et al., *Bull. Chem. Soc. Japan*, 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry*, 1, No. 3 (1970). Among these, an oxazole compound substituted with a trihalomethyl group, and an S-triazine compound are preferred.

Furthermore, an s-triazine derivative having at least one mono-, di- or tri-halogenated methyl group bonded to the s-triazine ring is more preferred, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and the following compounds.

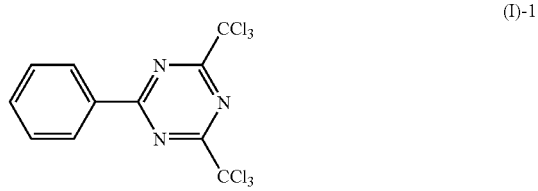

(I)-1

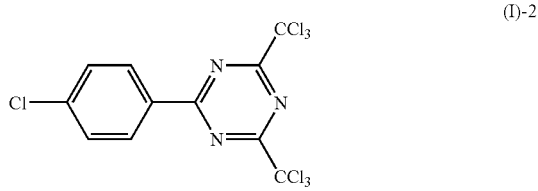

(I)-2

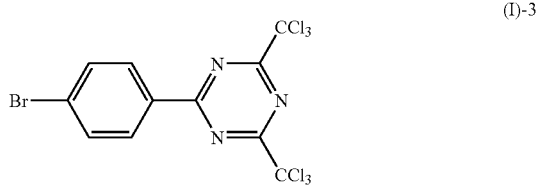

(I)-3

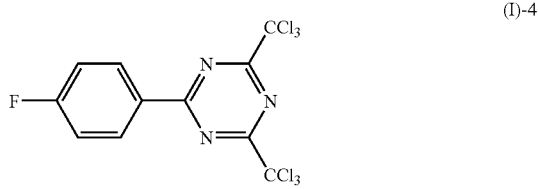

(I)-4

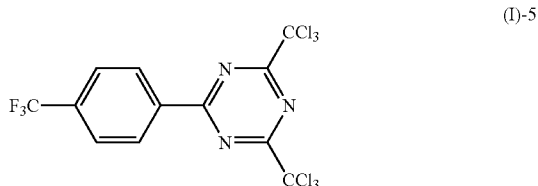

(I)-5

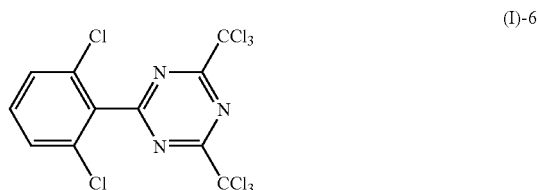

(I)-6

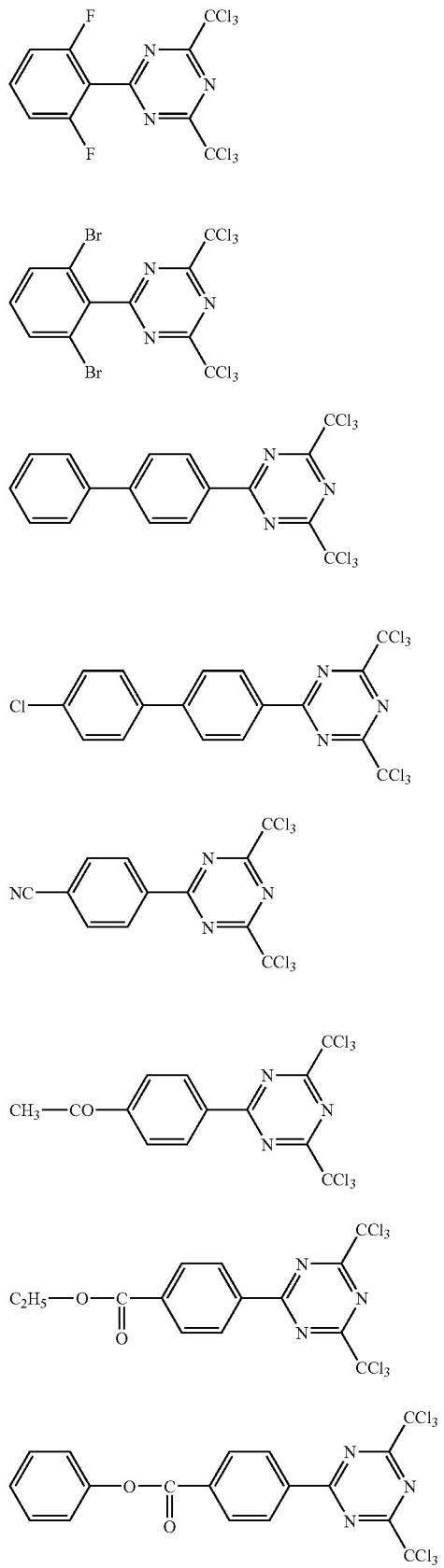
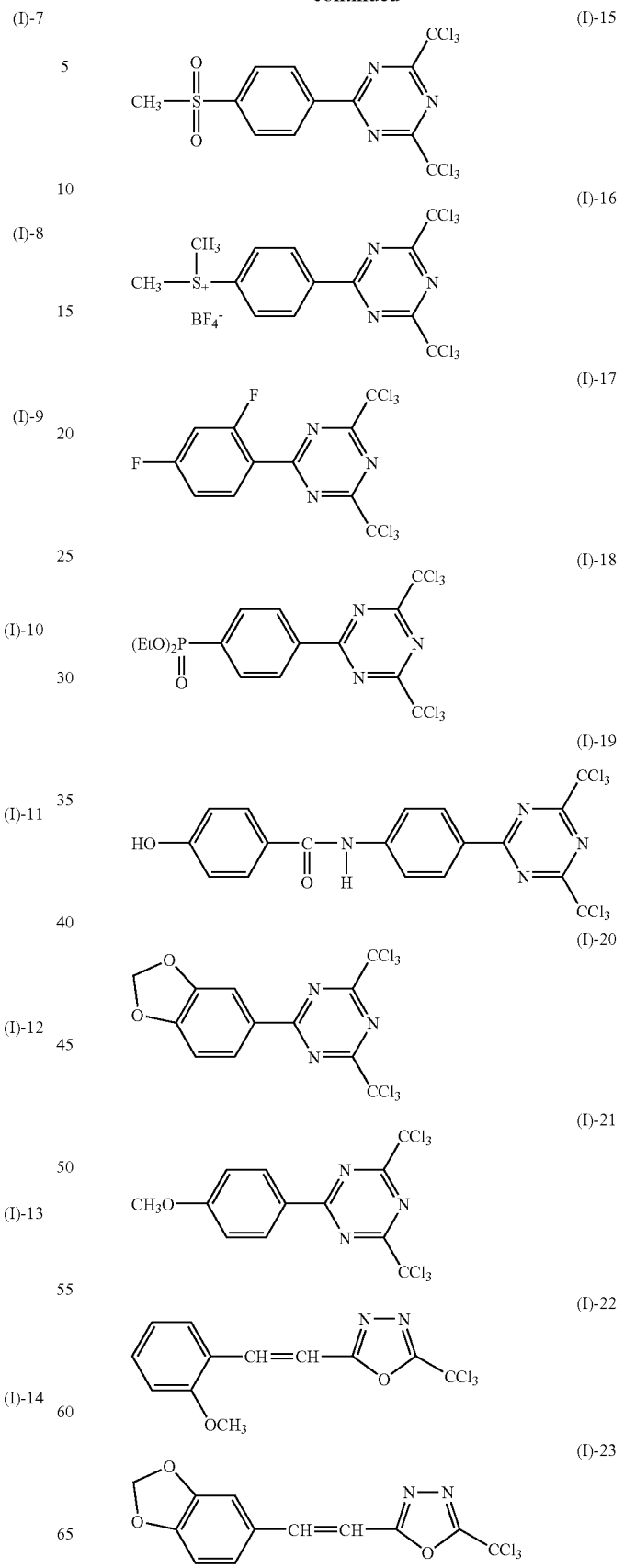

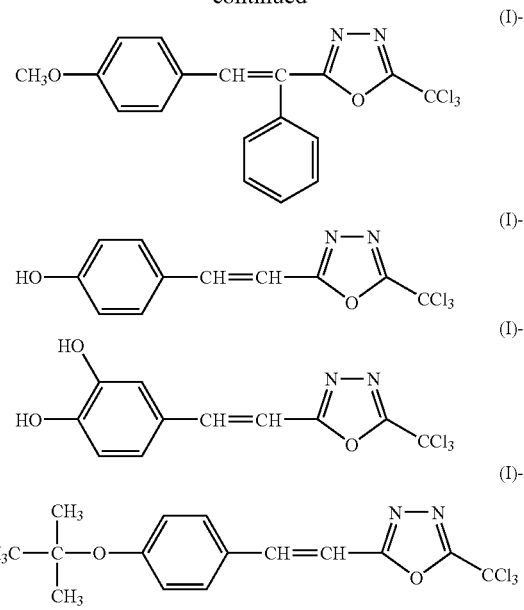

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone and 1,1,1-trichloromethyl-(p-butylphenyl)ketone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone and 2,4-diisopropylthioxanthone; and benzoic acid ester derivatives such as ethyl p-dimethylaminobenzoate and ethyl p-diethylaminobenzoate.

Examples of the azo-based compound which can be used include azo compounds described in JP-A-8-108621.

Examples of the organoperoxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tertiary carbonate, 3,3',4,4'-tetra(tert-butylperoxycarbonyl) benzophenone, 3,3',4,4'-tetra(tert-hexyl-peroxycarbonyl) benzophenone, 3,3',4,4'-tetra(p-isopropylcumylperoxycarbonyl)benzophenone, carbonyl di(tert-butylperoxydihydrogendiphthalate) and carbonyl di(tert-hexylperoxydihydrogendiphthalate).

Examples of the metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl, bis(cyclopentadienyl)-bis(2,6-difluoro-3-(pyr-1-yl)phenyl)titanium and iron-allene complexes described in JP-A-1-304453 and JP-A-1-152109.

Examples of the hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4', 5,5'-tetraphenylbiimidazole.

Examples of the organoboron compound include organoborates described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539, and Martin Kunz, *Rad Tech '98. Proceeding* Apr. 19-22, 1998, Chicago; organoboron sulfonium complexes and organoboron oxosulfonium complexes described in JP-A-6-157623, JP-A-6-175564 and JP-A-6-175561; organoboron iodonium complexes described in JP-A-6-175554 and JP-A-6-175553; organoboron phosphonium complexes described in JP-A-9-188710; and organoboron transition metal coordination complexes described in JP-A-6-348011, JP-A-7-128785, JP-A-7-140589, JP-A-7-306527 and JP-A-7-292014.

Examples of the disulfone compound include compounds described in JP-A-61-166544 and JP-A-2003-328465.

Examples of the oxime ester compound include compounds described in *J.C.S. Perkin II*, 1653-1660 (1979), *J.C.S. Perkin II*, 156-162 (1979), *Journal of Photopolymer Science and Technology*, 202-232 (1995), JP-A-2000-66385 and JP-A-2000-80068. Specific examples thereof include the compounds represented by the following structural formulae.

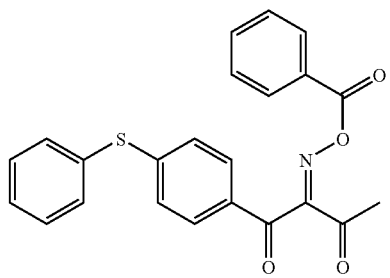

-continued
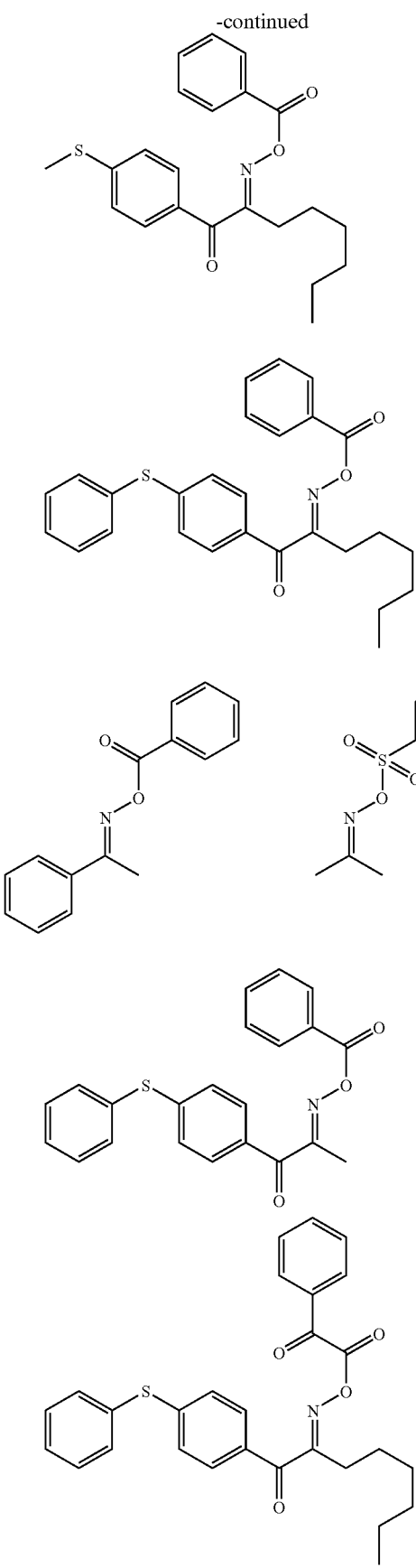
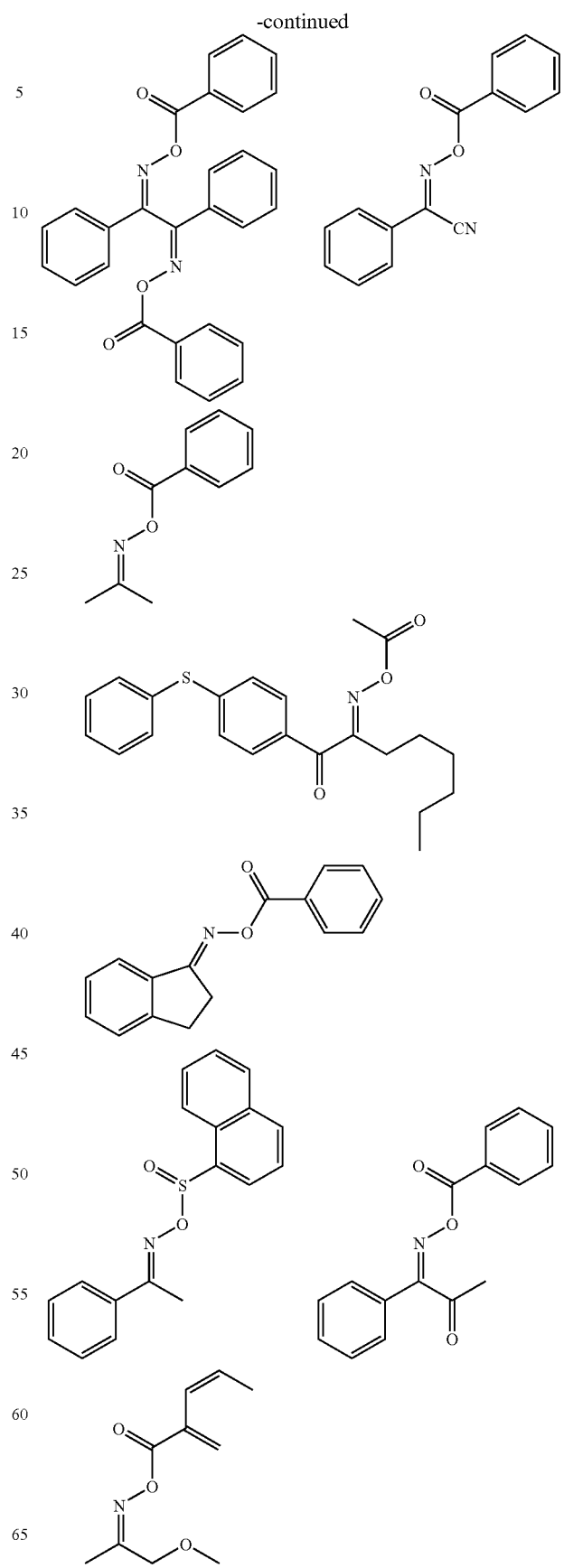

-continued

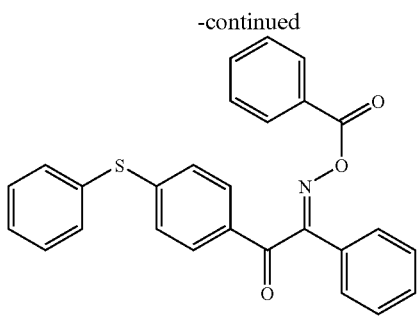

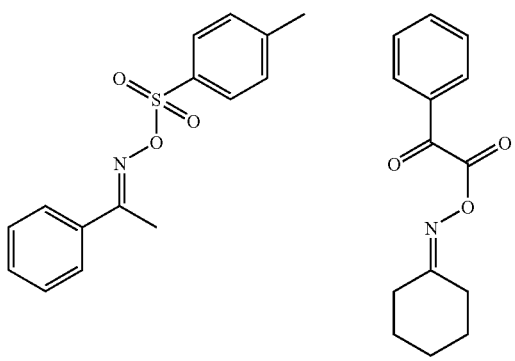

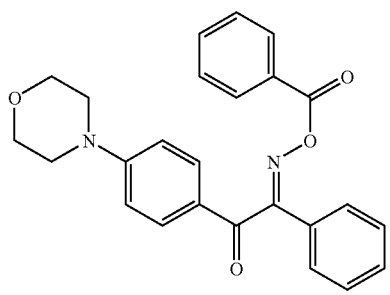

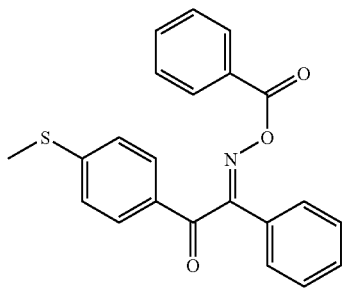

-continued

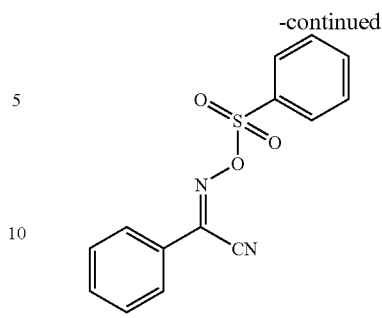

Examples of the onium salt compound include onium salts such as diazonium salts described in S. I. Schlesinger, *Photogr. Sci. Eng.*, 18, 387 (1974) and T. S. Bal et al., *Polymer*, 21, 423 (1980); ammonium salts described in U.S. Pat. No. 4,069, 055 and JP-A-4-365049; phosphonium salts described in U.S. Pat. Nos. 4,069,055 and 4,069,056; iodonium salts described in European Patent 104,143, U.S. Pat. Nos. 339, 049 and 410,201, JP-A-2-150848 and JP-A-2-296514; sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833, 827, and German Patents 2,904,626, 3,604,580 and 3,604, 581; selenonium salts described in J. V. Crivello et al., *Macromolecules*, 10 (6), 1307 (1977) and J. V. Crivello et al., *J. Polymer Sci.*, Polymer Chem. Ed., 17, 1047 (1979); and arsonium salts described in C. S. Wen et al., *Teh. Proc. Conf. Rad. Curing ASIA*, page 478 (Tokyo, October 1988).

In the present invention, such an onium salt functions not as an acid generator but as an ionic radical polymerization initiator.

The onium salt which is suitably used in the present invention is an onium salt represented by any one of the following formulae (RI-I) to (RI-III):

$$Ar_{11}\!-\!\overset{+}{N}\!\equiv\!N \quad Z_{11}^{-} \qquad (RI\text{-}I)$$

$$Ar_{21}\!-\!\overset{+}{I}\!-\!Ar_{22} \quad Z_{21}^{-} \qquad (RI\text{-}II)$$

$$\begin{array}{c} R_{31} \\ \diagdown \\ \overset{+}{S}\!-\!R_{33} \quad Z_{31}^{-} \\ \diagup \\ R_{32} \end{array} \qquad (RI\text{-}III)$$

In formula (RI-I), $Ar_{11}$ represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{11}^{-}$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion and sulfinate ion are preferred in view of stability.

In formula (RI-II), $Ar_{21}$ and $Ar_{22}$ each independently represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{21}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and carboxylate ion are preferred in view of stability and reactivity.

In formula (RI-III), $R_{31}$, $R_{32}$ and $R_{33}$ each independently represents an aryl, alkyl, alkenyl or alkynyl group having 20 or less carbon atoms, which may have from 1 to 6 substituent(s), and in view of reactivity and stability, preferably represents an aryl group. Examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and carboxylate ion are preferred in view of stability and reactivity. In particular, carboxylate ion described in JP-A-2001-343742 is more preferred, and carboxylate ion described in JP-A-2002-148790 is still more preferred.

Specific examples of the onium salt compound suitable for the present invention are set forth below, but the present invention is not limited thereto.

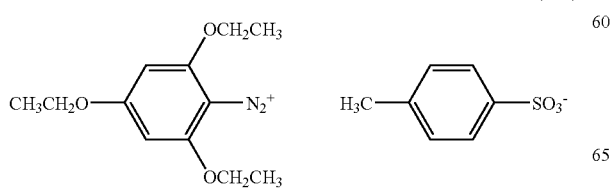

(N-1)

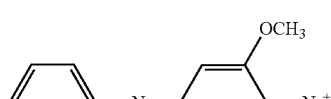

(N-2)

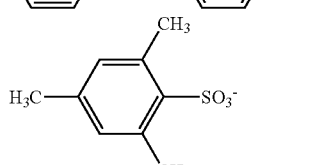

(N-3)

(N-4)

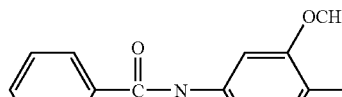

(N-5)

(N-6)

(N-7)

(N-8)

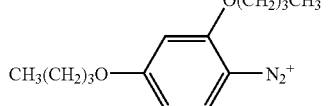

(N-9)

(N-10)

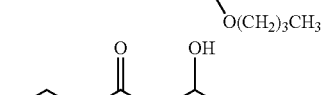

(N-11)

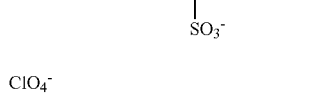

PF$_6^-$ (N-12)
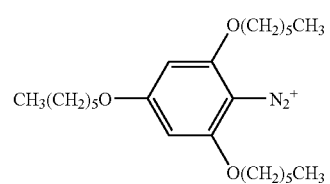 (N-13)
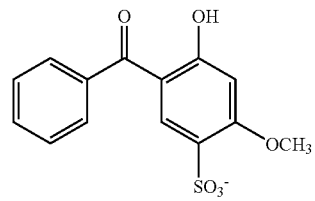
ClO$_4^-$ (N-14)
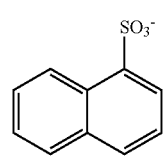 (N-15)
PF$_6^-$ (N-16)
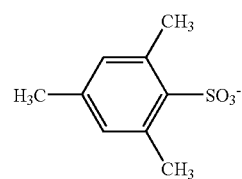 (N-17)
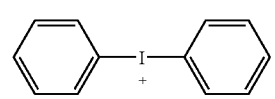     H$_3$C——SO$_3^-$ (I-1)
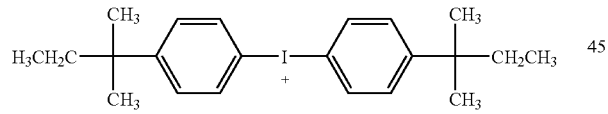 (I-2)
PF$_6^-$ (I-3)
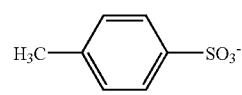 (I-4)
ClO$_4^-$ (I-5)
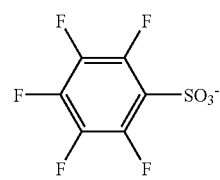 (I-6)
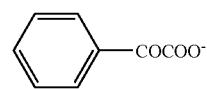 (I-7)
CF$_3$SO$_3^-$ (I-8)
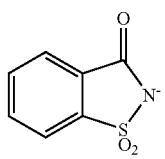 (I-9)
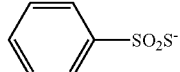 (I-10)
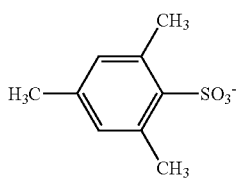 (I-11)
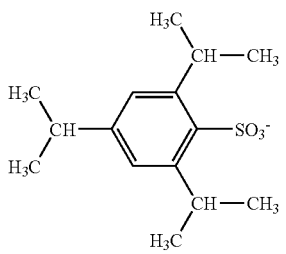 (I-12)
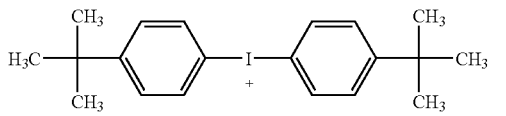 (I-13)
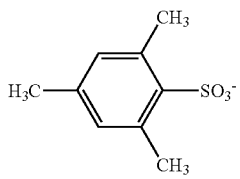 
ClO$_4^-$ (I-14)
PF$_6^-$ (I-15)
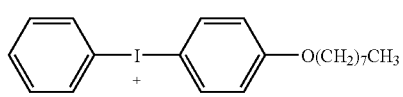 (I-16)
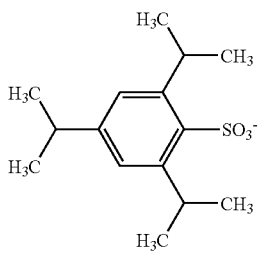
CF$_3$COO$^-$ (I-17)
CF$_3$SO$_3^-$ (I-18)

-continued
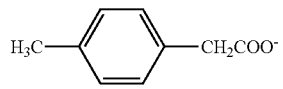 (I-19)
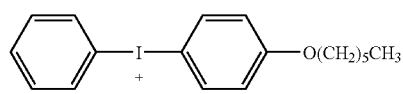 (I-20)
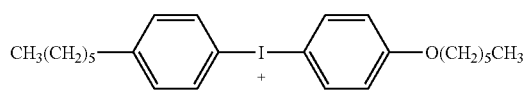 (I-21)
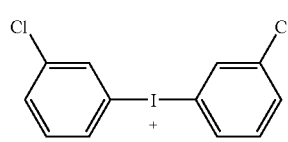 (I-22)
BF$_4^-$
 (I-23)
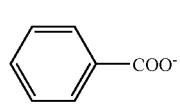 (I-24)
(S-1)
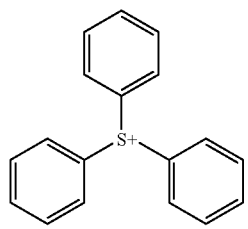
PF$_6^-$ (S-2)
ClO$_4^-$ (S-3)
(S-4)
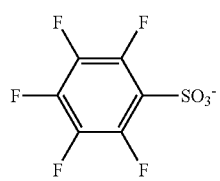
(S-5)
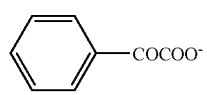
CF$_3$SO$_3^-$ (S-6)
-continued
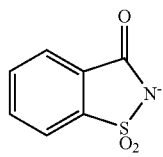 (S-7)
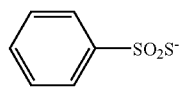 (S-8)
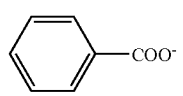 (S-9)
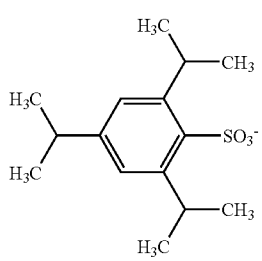 (S-10)
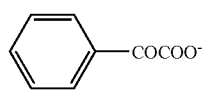 (S-11)
(S-12)
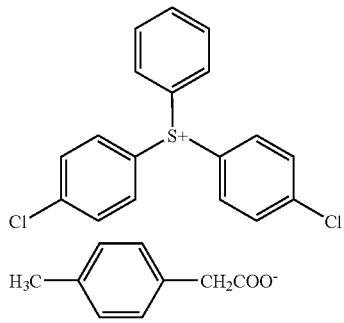
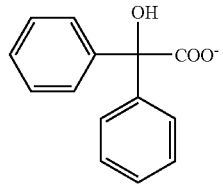 (S-13)
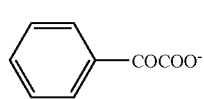 (S-14)

-continued

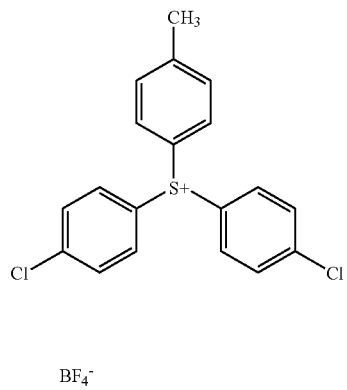
(S-15)

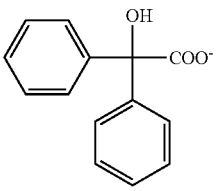
(S-16)

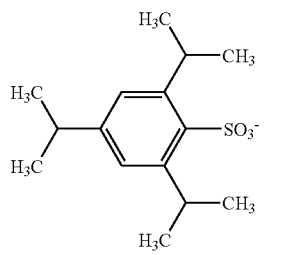
(S-17)

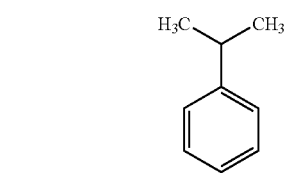

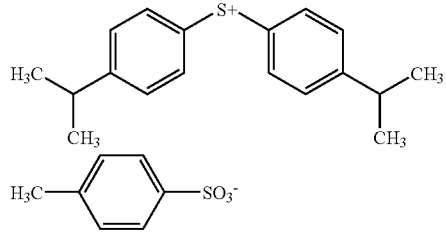
(S-18)

The polymerization initiator is not limited to those described above but particularly, in view of reactivity and stability, a triazine-based initiator, an organohalogen compound, an oxime ester compound, a diazonium salt, an iodonium salt and a sulfonium salt are more preferred.

One of these polymerization initiators may be used alone or two or more thereof may be used in combination. The polymerization initiator may be added to the same layer as other components or may be added to a layer separately provided. The polymerization initiator can be added at a ratio of preferably from 0.1 to 50 mass %, more preferably from 0.5 to 30 mass %, still more preferably from 0.8 to 20 mass %, based on all solid contents constituting the image recording layer.

<Polymerizable Compound>

The polymerizable compound which can be used in the present invention is an addition-polymerizable compound having at least one ethylenically unsaturated double bond and is selected from compounds having at least one, preferably two or more, ethylenically unsaturated bond(s). Such compounds are widely known in this industrial field and these known compounds can be used in the present invention without any particular limitation.

These compounds have a chemical mode such as a monomer, a prepolymer (that is, dimer, trimer or oligomer) or a mixture or copolymer thereof Examples of the monomer and its copolymer include an unsaturated carboxylic acid (e.g., acrylic acid, methacrylic acid, itaconic acid, crotonic acid, isocrotonic acid, maleic acid), and esters and amides thereof Among these, preferred are an ester of an unsaturated carboxylic acid with an aliphatic polyhydric alcohol compound, and an amide of an unsaturated carboxylic acid with an aliphatic polyvalent amine compound. Also, an addition reaction product of an unsaturated carboxylic acid ester or amide having a nucleophilic substituent such as hydroxyl group, amino group or mercapto group with a monofunctional or polyfunctional isocyanate or epoxy, and a dehydrating condensation reaction product with a monofunctional or polyfunctional carboxylic acid may be suitably used. Furthermore, an addition reaction product of an unsaturated carboxylic acid ester or amide having an electrophilic substituent such as isocyanate group or epoxy group with a monofunctional or polyfunctional alcohol, amine or thiol, and a displacement reaction product of an unsaturated carboxylic acid ester or amide having a desorptive substituent such as halogen group or tosyloxy group with a monofunctional or polyfunctional alcohol, amine or thiol may also be suitably used. Other than these, compounds where the unsaturated carboxylic acid of the above-described compound is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Examples of other esters include aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Other preferred examples of the amide-type monomer include those having a cyclohexylene structure described in JP-B-54-21726.

A urethane-based addition-polymerizable compound produced by using an addition reaction of an isocyanate with a hydroxyl group is also preferred and specific examples thereof include a vinyl urethane compound having two or more polymerizable vinyl groups within one molecule described in JP-B-48-41708, which are obtained by adding a vinyl monomer having a hydroxyl group represented by the following formula (A) to a polyisocyanate compound having two or more isocyanate groups within one molecule:

CH$_2$=C(R$_4$)COOCH$_2$CH(R$_5$)OH    (A)

(wherein R$_4$ and R$_5$ each represents H or CH$_3$).

In addition, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, by using addition-polymerizable compounds having an amino or sulfide structure within the molecule described in JP-A-63-277653, JP-A-63-260909 and JP-A-1-105238, a photopolymerizable composition having very excellent photosensitization speed can be obtained.

Other examples include a polyfunctional acrylate or methacrylate such as polyester acrylates described in JP-A-48-64183, JP-B-49-43191 and JP-B-52-30490 and epoxy acrylates obtained by reacting an epoxy resin with a (meth)acrylic acid. In addition, a specific unsaturated compound described in JP-B-46-43946, JP-B-1-40337 and JP-B-1-40336, and a vinyl phosphonic acid-based compound described in JP-A-2-25493 may be used.

In some cases, a structure containing a perfluoroalkyl group described in JP-A-61-22048 is suitably used. Furthermore, those described as a photocurable monomer or oligomer in *Adhesion*, Vol. 20, No. 7, pp. 300-308 (1984) may also be used.

Details of the usage of these addition-polymerizable compounds, such as structure, sole or combination use and amount added, can be freely selected in accordance with the performance design of final lithographic printing plate precursor and, for example, may be selected from the following standpoints.

In view of sensitivity, a structure having a large unsaturated group content per one molecule is preferred and in many cases, a bifunctional or greater functional compound is preferred. For increasing the strength of image area, namely, cured film, a trifunctional or greater functional compound is preferred. Also, a method of controlling both sensitivity and strength by using a combination of compounds differing in the functional number and in the polymerizable group (for example, an acrylic acid ester, a methacrylic acid ester, a styrene-based compound or a vinyl ether-based compound) is effective.

The selection and usage of the addition-polymerizable compound are important factors also for the compatibility and dispersibility with other components (e.g., water-insoluble polymer, initiator, colorant) in the image recording layer. For example, the compatibility may be improved in some cases by using a low purity compound or using two or more compounds in combination. Also, a specific structure may be selected for the purpose of enhancing the adhesion to the substrate, protective layer which is described later, or the like.

The polymerizable compound is preferably used in an amount of 5 to 80 mass %, more preferably from 25 to 75 mass %, based on all solid contents constituting the image recording layer. Also, these polymerizable compounds may be used individually or in combination of two or more thereof.

Other than these, as for the usage of the polymerizable compound, an appropriate structure, formulation or amount added can be freely selected by taking account of the degree of polymerization inhibition due to oxygen, resolution, fogging, change in refractive index, surface tackiness and the like. Depending on the case, a layer structure or coating method such as undercoat and overcoat can also be employed.

<Infrared Absorbent>

In the image recording layer of the lithographic printing plate precursor which is imagewise exposed by using a light source of emitting infrared ray, an infrared absorbent may be used in combination with the above-described polymerization initiator. The infrared absorbent generally has a function of converting the absorbed infrared ray into heat and by the effect of heat generated here, the polymerization initiator thermally decomposes to generate a radical. The infrared absorbent for use in the present invention is a dye or pigment having an absorption maximum at a wavelength of 760 to 1,200 nm.

As for the dye, commercially available dyes and known dyes described in publications such as *Senryo Binran* (*Handbook of Dyes*), compiled by Yuki Gosei Kagaku Kyokai (1970) may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356 and JP-A-60-7.8787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, a near infrared absorbing sensitizer described in U.S. Pat. No. 5,156,938 may be suitably used. Furthermore, a substituted arylbenzo(thio)pyrylium salt described in U.S. Pat. No. 3,881,924, a trimethinethiapyrylium salt described in JP-A-57-142645 (corresponding to U.S. Pat. No. 4,327,169), a pyrylium-based compound described in JP-A-58-181051, JP-A-58-220143, JP-A-59-41363, JP-A-59-84248, JP-59-84249, JP-A-59-146063 and JP-A-59-146061, a cyanine dye described in JP-A-59-216146, a pentamethinethiapyrylium salt described in U.S. Pat. No. 4,283,475, and a pyrylium compound described in JP-B-5-13514 and JP-B-5-19702 may also be preferably used. Other preferred examples of the dye include near infrared absorbing dyes represented by formulae (I) and (II) of U.S. Pat. No. 4,756,993.

Among these dyes, preferred are a cyanine dye, a squarylium dye, a pyrylium salt, a nickel thiolate complex and an indolenine cyanine dye, more preferred are a cyanine dye and an indolenine cyanine dye, still more preferred is a cyanine dye represented by the following formula (I):

Formula (I):

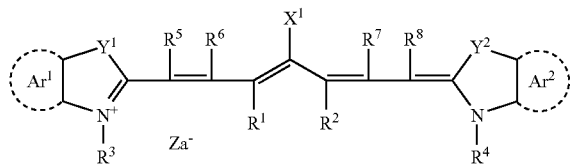

In formula (I), $X^1$ represents a hydrogen atom, a halogen atom, —$NPh_2$, $X^2$-$L^1$ or a group shown below:

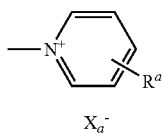

wherein $X^2$ represents an oxygen atom, a nitrogen atom or a sulfur atom, $L^1$ represents a hydrocarbon group having from 1 to 12 carbon atoms, an aromatic ring having a heteroatom, or a hydrocarbon group having from 1 to 12 carbon atoms and containing a heteroatom (the heteroatom as used herein indicates N, S, O, a halogen atom or Se), $X_a^-$ has the same definition as $Za^-$ described later, and $R^a$ represents a substituent selected from a hydrogen atom, an alkyl group, an aryl group, a substituted or unsubstituted amino group and a halogen atom.

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring, and preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms, and in view of availability of the raw material, preferably represents a hydrogen atom. $Za^-$ represents a counter anion, but when the cyanine dye represented by formula (II) has an anionic substituent in its structure and neutralization of electric charge is not necessary, $Za^-$ is not present. In view of storage stability of the coating solution for the recording layer, $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (I), which can be suitably used in the present invention, include those described in paragraphs [0017] to [0019] of JP-A-2001-133969.

Other preferred examples include a specific indolenine cyanine dye described in JP-A-2002-278057.

As for the pigment used in the present invention, commercially available pigments and pigments described in *Color Index (C.I.) Binran (C.I. Handbook)*, *Saishin Ganryo Binran (Handbook of Newest Pigments)*, compiled by Nippon Ganryo Gijutsu Kyokai (1977), *Saishin Ganryo Oyo Gijutsu (Newest Pigment Application Technology)*, CMC Shuppan (1986), and *Insatsu Ink Gijutsu (Printing Ink Technology)*, CMC Shuppan (1984) can be used.

The kind of pigment includes a black pigment, a yellow pigment, an orange pigment, a brown pigment, a red pigment, a violet pigment, a blue pigment, a green pigment, a fluorescent pigment, a metal powder pigment and a polymer bond pigment. Specific examples of the pigment which can be used include an insoluble azo pigment, an azo lake pigment, a condensed azo pigment, a chelate azo pigment, a phthalocyanine-based pigment, an anthraquinone-based pigment, a perylene- or perynone-based pigment, a thioindigo-based pigment, a quinacridone-based pigment, a dioxazine-based pigment, an isoindolinone-based pigment, a quinophthalone-based pigment, a dyed lake pigment, an azine pigment, a nitroso pigment, a nitro pigment, a natural pigment, a fluorescent pigment, an inorganic pigment and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, silane coupling agent, epoxy compound or isocyanate) to the pigment surface. These surface-treating methods are described in *Kinzoku Sekken no Seishitsu to Oyo (Properties and Application of Metal Soap)*, Saiwai Shobo, *Insatsu Ink Gijutsu (Printing Ink Technology)*, CMC Shuppan (1984), and *Saishin Ganryo Oyo Gijutsu (Newest Pigment Application Technology)*, CMC Shuppan (1986).

The particle diameter of the pigment is preferably from 0.01 to 10 μm, more preferably from 0.05 to 1 μm, still more preferably from 0.1 to 1 μm. Within this range, good stability of the pigment dispersion in the coating solution for the image recording layer and good uniformity of the image recording layer can be obtained.

For dispersing the pigment, a known dispersion technique used in the production of ink or toner may be used. Examples of the dispersing machine include an ultrasonic disperser, a sand mill, an attritor, a pearl mill, a super-mill, a ball mill, an impeller, a disperser, a KD mill, a colloid mill, a dynatron, a three-roll mill and a pressure kneader. These are described in detail in *Saishin Ganryo Oyo Gijutsu (Newest Pigment Application Technology)*, CMC Shuppan (1986).

The amount of the infrared absorbent added to the image recording layer is preferably a necessary minimum amount so as to suppress the side effect of inhibiting the polymerization reaction.

The infrared absorbent can be added at a ratio of 0.001 to 50 mass %, preferably from 0.005 to 30 mass %, more preferably from 0.01 to 10 mass %, based on the entire solid content of the image recording layer. Within this range, high sensitivity can be obtained without adversely affecting the uniformity or film strength of the image recording layer.

<Sensitizing Dye>

In the image recording layer of the lithographic printing plate precursor which is imagewise exposed by using a light source of emitting light at 250 to 420 nm, a sensitizing dye may be used in combination with the above-described polymerization initiator so as to elevate the radical generation efficiency.

Specific examples of the sensitizing dye include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-tert-butyl-9,10-anthraquinone, 2,6-dichloro-9,10-anthraquinone, xanthone, 2-methylxanthone, 2-methoxyxanthone, thioxanthone, benzyl, dibenzylacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone, benzanthrone and 2,5-bis(4-diethylaminophenyl)-1,3,4-oxadiazole.

Furthermore, preferred examples of the sensitizing dye for use in the present invention include a compound represented by formula (II) described in JP-B-51-48516:

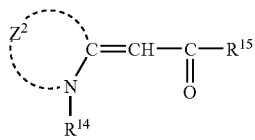

(II)

wherein $R^{14}$ represents an alkyl group (e.g., methyl, ethyl, propyl) or a substituted alkyl group (e.g., 2-hydroxyethyl, 2-methoxyethyl, carboxymethyl, 2-carboxyethyl); $R^{15}$ represents an alkyl group (e.g., methyl, ethyl) or an aryl group (e.g., phenyl, p-hydroxyphenyl, naphthyl, thienyl); and $Z^2$ represents a nonmetallic atom group necessary for forming a nitrogen-containing heterocyclic nucleus usually used in a cyanine dye, for example, benzothiazoles (e.g., benzothiazole, 5-chlorobenzothiazole, 6-chlorobenzothiazole), naphthothiazoles (e.g., α-naphthothiazole, β-naphthothiazole), benzoselenazoles (e.g., benzoselenazole, 5-chlorobenzoselenazole, 6-methoxybenzoselenazole), naphthoselenazoles (e.g., α-naphthoselenazole, β-naphthoselenazole), benzoxazoles (e.g., benzoxazole, 5-methylbenzoxazole, 5-phenylbenzoxazole) and naphthoxazoles (e.g., α-naphthoxazole, β-naphthoxazole).

Specific examples of the compound represented by formula (II) include those having a chemical structure constituted by combining these $Z^2$, $R^{14}$ and $R^{15}$. Many of such compounds are present as a known substance and therefore, the compound used may be appropriately selected from those known substances. Other preferred examples of the sensitizing dye for use in the present invention include a merocyanine dye described in JP-B-5-47095 and a ketocoumarin-based compound represented by the following formula (III):

(III)

wherein $R^{16}$ represents an alkyl group such as methyl group and ethyl group.

In addition, a merocyanine-based dye described in JP-A-2000-147763 can also be used as the sensitizing dye, and a sensitizing dye described in JP-A-2001-100412 is also preferred. Specific examples thereof include the following compounds.

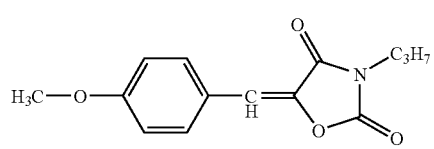

D-1

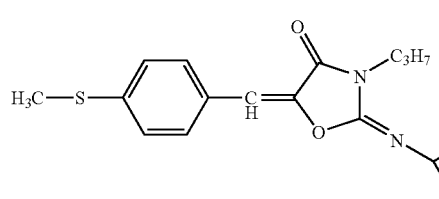

D-2

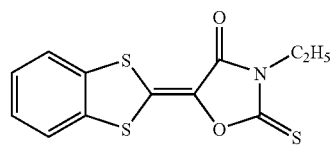

D-3

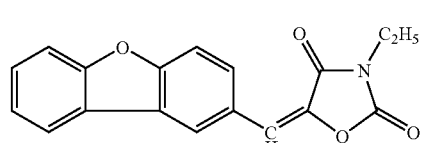

D-4

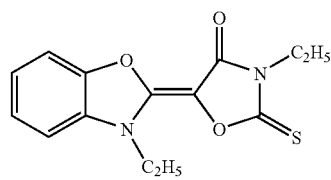

D-5

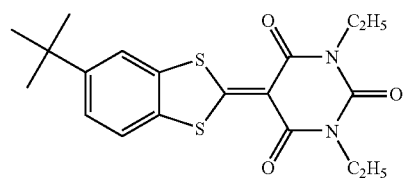

D-6

-continued

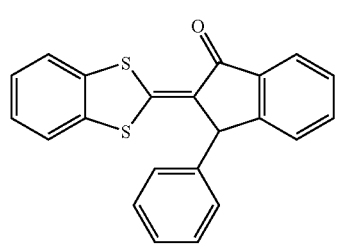
D-7

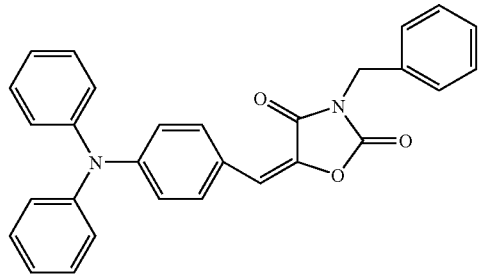
D-13

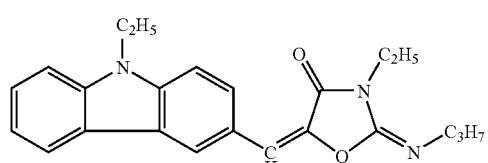
D-8

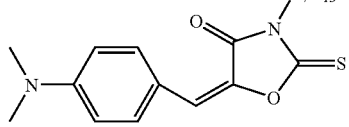
D-14

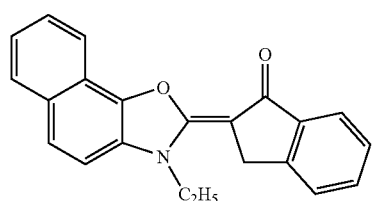
D-9

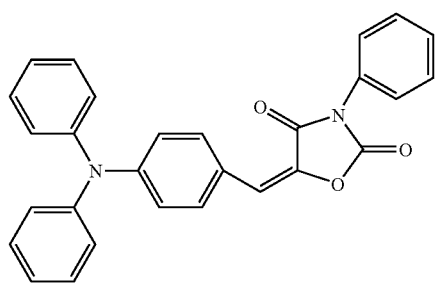
D-15

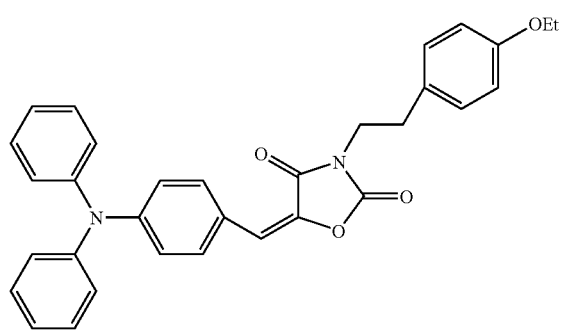
D-10

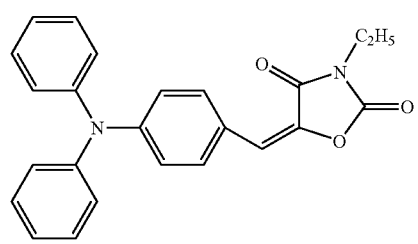
D-11

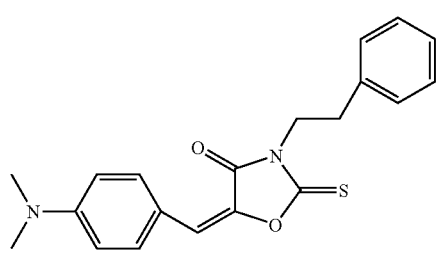
D-12

The sensitizing dye can be added at a ratio of preferably from 0.1 to 50 mass %, more preferably from 0.5 to 30 mass %, still more preferably from 0.8 to 20 mass %, based on all solid contents constituting the image recording layer.

<Microcapsule Microgel>

In the present invention, as the method for incorporating the image recording layer-constituting components into the image recording layer, several embodiments may be used. One embodiment is a molecular dispersion-type image recording layer described, for example, in JP-A-2002-287334, which is formed by dissolving the constituent components in an appropriate solvent and coating the resulting solution. Another embodiment is a microcapsule-type image recording layer described, for example, in JP-A-2001-277740 and JP-A-2001-277742, where all or a part of the constituent components are enclosed in a microcapsule and incorporated into the image recording layer. In the microcapsule-type image recording layer, the constituent components may be incorporated also outside the microcapsule. Here, it is a preferred embodiment of the microcapsule-type image forming layer that hydrophobic constituent components are enclosed in the microcapsule and hydrophilic components are incorporated outside the microcapsule. Still another embodiment is an image recording layer containing a crosslinked resin particle, namely, a microgel. The microgel may contain a part of the constituent components in the inside and/or on the surface of the microgel. Particularly, an embodiment where the microgel is a reactive microgel having a polymerizable compound on the surface thereof is preferred in view of image-forming sensitivity and press life.

In order to obtain higher on-press developability, the image recording layer is preferably a microcapsule-type or microgel-type image recording layer.

As for the method of forming the constituent components of the image recording layer into a microcapsule or a microgel, known methods can be applied.

Examples of the method for producing a microcapsule include, but are not limited to, a method utilizing coacervation described in U.S. Pat. Nos. 2,800,457 and 2,800,458, a method utilizing interfacial polymerization described in U.S. Pat. No. 3,287,154, JP-B-38-19574 and JP-B-42-446, a method utilizing precipitation of a polymer described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall-forming material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method utilizing monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074.

The microcapsule wall for use in the present invention preferably has three-dimensional crosslinking and has a property of swelling with a solvent. In this viewpoint, the wall material of microcapsule is preferably polyurea, polyurethane, polyester, polycarbonate, polyamide or a mixture thereof, more preferably polyurea or polyurethane. A compound having a crosslinking functional group such as ethylenically unsaturated bond introducible into a binder polymer may be introduced into the microcapsule wall.

On the other hand, the microgel may be prepared by the granulation method utilizing interfacial polymerization described in JP-B-38-19574 and JP-B-42-446, or the granulation method utilizing a non-aqueous dispersion polymerization described in JP-A-5-61214, but the present invention is not limited to these methods.

As for the method utilizing interfacial polymerization, the above-described known methods for producing a microcapsule may be applied.

The microgel for use in the present invention is preferably a microgel having three-dimensional crosslinking and being granulated by interfacial polymerization. From this standpoint, the material used therefor is preferably polyurea, polyurethane, polyester, polycarbonate, polyamide or a mixture thereof, more preferably polyurea or polyurethane.

The average particle diameter of the microcapsule or microgel is preferably from 0.01 to 3.0 µm, more preferably from 0.05 to 2.0 µm, still more preferably from 0.10 to 1.0 µm. Within this range, high resolution and good aging stability can be obtained.

<Other Components of Image Recording Layer>

The image recording layer of the present invention may further contain various additives, if desired. These are described below.

<Surfactant>

In the present invention, a surfactant is preferably used in the image recording layer so as to accelerate the development and enhance the coated surface state. The surfactant includes a nonionic surfactant, an anionic surfactant, a cationic surfactant, an amphoteric surfactant, a fluorine-containing surfactant and the like. The surfactants may be used individually or in combination of two or more thereof.

The nonionic surfactant for use in the present invention is not particularly limited and a conventionally known nonionic surfactant can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, a polyoxyethylene alkylamine, a triethanolamine fatty acid ester, a trialkylamine oxide, a polyethylene glycol and a copolymer of polyethylene glycol and polypropylene glycol.

The anionic surfactant for use in the present invention is not particularly limited and a conventionally known anionic surfactant can be used. Examples thereof include fatty acid salts, abietates, hydroxyalkanesulfonates, alkanesulfonates, dialkylsulfosuccinic ester salts, linear alkylbenzenesulfonates, branched alkylbenzenesulfonates, alkylnaphthalenesulfonates, alkylphenoxypolyoxyethylenepropylsulfonates, polyoxyethylenealkylsulfophenyl ether salts, an N-methyl-N-oleyltaurine sodium salt, a monoamide disodium N-alkylsulfosuccinate, petroleum sulfonates, a sulfated beef tallow oil, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene/maleic anhydride copolymerization products, partially saponified olefin/maleic anhydride copolymerization products, and naphthalenesulfonate formalin condensates.

The cationic surfactant for use in the present invention is not particularly limited and a conventionally known cationic surfactant can be used. Examples thereof include alkylamine salts, quaternary ammonium salts, polyoxyethylene alkylamine salts and polyethylene polyamine derivatives.

The amphoteric surfactant for use in the present invention is not particularly limited and a conventionally known amphoteric surfactant can be used. Examples thereof include carboxybetaines, aminocarboxylic acids, sulfobetaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester; an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, a fluorine-containing surfactant described in JP-A-62-170950, JP-A-62-226143 and JP-A-60-168144 may also be suitably used.

The surfactants can be used individually or in combination of two or more thereof The surfactant content is preferably from 0.001 to 10 mass %, more preferably from 0.01 to 7 mass %, based on the entire solid content of the image recording layer.

<Hydrophilic Polymer>

In the present invention, a hydrophilic polymer may be incorporated so as to enhance the developability and dispersion stability of microcapsules.

Suitable examples of the hydrophilic polymer include those having a hydrophilic group such as hydroxy group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonic acid group and phosphoric acid group.

Specific examples thereof include gum arabic, casein, gelatin, a starch derivative, carboxymethyl cellulose or a sodium salt thereof, cellulose acetate, sodium alginate, vinyl acetate-maleic acid copolymers, styrene-maleic acid copolymers, polyacrylic acids or a salt thereof, polymethacrylic acids or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycols, hydroxypropylene polymers, polyvinyl alcohols, a hydrolyzed polyvinyl acetate having a hydrolysis degree of 60 mol % or more, preferably 80 mol % or more, polyvinyl formal, polyvinyl butyral, polyvinylpyrrolidone, a homopolymer or polymer of acrylamide, a homopolymer or copolymer of methacrylamide, a homopolymer or copolymer of N-methylolacrylamide, polyvinylpyrrolidone, alcohol-soluble nylon, and a polyether of 2,2-bis-(4-hydroxyphenyl)-propane with epichlorohydrin.

The hydrophilic polymer preferably has a mass average molecular weight of 5,000 or more, more preferably from 10,000 to 300,000. The hydrophilic polymer may be a random polymer, a block polymer, a graft polymer or the like.

The content of the hydrophilic polymer in the image recording layer is preferably 20 mass % or less, more preferably 10 mass % or less, based on the entire solid content of the image recording layer.

<Colorant>

In the present invention, a dye having large absorption in the visible light region can be used as a colorant for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and a dye described in JP-A-62-293247. Also, a pigment such as phthalocyanine-based pigment, azo-based pigment, carbon black and titanium oxide may be suitably used.

The colorant is preferably added, because the image area and the non-image area after image formation can be clearly distinguished. The amount of the colorant added is preferably from 0.01 to 10 mass % based on the entire solid content of the image recording material.

<Printing-Out Agent>

In the image recording layer of the present invention, a compound of undergoing discoloration by the effect of an acid or a radical can be added so as to produce a print-out image. As such a compound, for example, various dyes such as diphenylmethane-based, triphenylmethane-based, thiazine-based, oxazine-based, xanthene-based, anthraquinone-based, iminoquinone-based, azo-based and azomethine-based dyes are effective.

Specific examples thereof include dyes such as Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red SB [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminotriphenyl methane (Leuco Crystal Violet) and Pergascript Blue SRB (produced by Ciba Geigy).

Other suitable examples include leuco dyes known as a material for heat-sensitive or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye of undergoing discoloration by the effect of an acid or a radical is preferably added in an amount of 0.01 to 15 mass % based on the solid content of the image recording layer.

<Polymerization Inhibitor>

In the image recording layer of the present invention, a small amount of a thermopolymerization inhibitor is preferably added so as to prevent the radical polymerizable compound from undergoing unnecessary thermopolymerization during the preparation or storage of the image recording layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The thermopolymerization inhibitor is preferably added in an amount of about 0.01 to about 5 mass % based on the entire solid content of the image recording layer.

<Higher Fatty Acid Derivative, Etc.>

In the image recording layer of the present invention, for example, a higher fatty acid derivative such as behenic acid or behenic acid amide may be added and localized on the surface of the image recording layer during drying after coating so as to prevent polymerization inhibition by oxygen. The amount of the higher fatty acid derivative added is preferably from about 0.1 to about 10 mass % based on the entire solid content of the image recording layer.

<Plasticizer>

The image recording layer of the present invention may contain a plasticizer. Suitable examples of the plasticizer include phthalic acid esters such as dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate. The plasticizer content is preferably about 30 mass % or less based on the entire solid content of the image recording layer.

<Inorganic Fine Particle>

The image recording layer of the present invention may contain an inorganic fine particle so as to elevate the cured film strength in the image area. Suitable examples of the inorganic fine particle include silica, alumina, magnesium oxide, titanium oxide, magnesium carbonate, calcium alginate and a mixture thereof. Even if such an inorganic fine particle has no light-to-heat converting property, the inorganic fine particle can be used, for example, for strengthening the film or roughening the surface to elevate the interfacial adhesion. The average particle diameter of the inorganic fine particle is preferably from 5 nm to 10 µm, more preferably from 0.5 to 3 µm. Within this range, the inorganic particles are stably dispersed in the image recording layer, so that the image recording layer can maintain sufficiently high film strength and the non-image area formed can have excellent hydrophilicity to cause less staining at printing.

Such an inorganic fine particle is easily available on the market as a colloidal silica dispersion or the like.

The inorganic fine particle content is preferably 20 mass % or less, more preferably 10 mass % or less, based on the entire solid content of the image recording layer.

<Low-Molecular Hydrophilic Compound>

The image recording layer of the present invention may contain a hydrophilic low-molecular compound so as to enhance the developability. Examples of the hydrophilic low-molecular compound include, as the water-soluble organic compound, glycols and ether or ester derivatives thereof, such as ethylene glycol, diethylene glycol, triethylene glycol, propylene glycol, dipropylene glycol and tripropylene glycol; polyhydroxys such as glycerin and pentaerythritol; organic amines and salts thereof, such as triethanolamine, diethanolamine and monoethanolamine; organic sulfonic acids and salts thereof, such as toluenesulfonic acid and benzenesulfonic acid; organic phosphonic acids and salts thereof, such as phenylphosphonic acid; organic carboxylic acids and salts thereof, such as tartaric acid, oxalic acid, citric acid, malic acid, lactic acid, gluconic acid and amino acids; and organic quaternary ammonium salts such as tetraethylamine hydrochloride.

In addition to the above-described components, the image recording layer of the present invention may contain, for example, a co-sensitizer.

When a co-sensitizer is used, the sensitivity of the photosensitive layer can be more enhanced. The operation mechanism thereof is not clearly known but is considered to mostly rely on the following chemical process. That is, the co-sensitizer is presumed to react with various intermediate active species (e.g., radical, peroxide, oxidant, reductant) generated in the process of a photoreaction initiated by the light absorption of the above-described initiation system and a subsequent addition polymerization reaction, thereby producing a new active radical. Such compounds can be roughly classified into (a) a compound which produces an active radical by undergoing reduction, (b) a compound which produces an active radical by undergoing oxidation, and (c) a compound which reacts with a low-activity radical to convert it into a more highly active radical or which acts as a chain transfer agent. However, in many cases, there is no commonly accepted opinion as for to which class individual compounds belong.

(a) Compound which Produces Active Radical by Undergoing Reduction

Compound Having Carbon-Halogen Bond:

This compound is considered to generate an active radical resulting from reductive cleavage of the carbon-halogen bond. Specific examples of the compound which can be suitably used include trihalomethyl-s-triazines and trihalomethyloxadiazoles.

Compound Having Nitrogen-Nitrogen Bond:

This compound is considered to generate an active radical resulting from reductive cleavage of the nitrogen-nitrogen bond. Specific examples of the compound which can be suitably used include hexaarylbiimidazoles.

Compound Having Oxygen-Oxygen Bond:

This compound is considered to generate an active radical resulting from reductive cleavage of the oxygen-oxygen bond. Specific examples of the compound which can be suitably used include organic peroxides.

Onium Compound:

This compound is considered to generate an active radical resulting from reductive cleavage of the carbon-hetero bond or oxygen-nitrogen bond. Specific examples of the compound which can be suitably used include diaryliodonium salts, triarylsulfonium salts and N-alkoxypyridinium (azinium) salts.

Ferrocene and Iron-Arene Complexes:

These compounds can reductively produce an active radical.

(b) Compound which Produces Active Radical by Undergoing Oxidation

Alkylate Complex:

This compound is considered to produce an active radical resulting from oxidative cleavage of the carbon-hetero bond. Specific examples of the compound which can be suitably used include triarylalkylborates.

Alkylamine Compound:

This compound is considered to produce an active radical by undergoing cleavage of the C—X bond on the carbon adjacent to nitrogen upon oxidation. Preferred examples of X include a hydrogen atom, a carboxyl group, a trimethylsilyl group and a benzyl group. Specific examples thereof include ethanolamines, N-phenylglycines and N-trimethylsilylmethylanilines.

Sulfur- or Tin-Containing Compound:

A compound resulting from replacing the nitrogen atom of the above-described amines by a sulfur or tin atom can produce an active radical based on the same activity. Also, a compound having an S—S bond is known to effect sensitization by undergoing S—S cleavage.

α-Substituted Methylcarbonyl Compound:

This compound can produce an active radical by undergoing cleavage of the carbonyl-α carbon bond upon oxidation. A compound resulting from converting the carbonyl into an oxime ether also exhibits the same activity. Specific examples thereof include 2-alkyl-1-[4-(alkylthio)phenyl]-2-morpholinopulonone-1 compounds, and oxime ethers obtained by reacting these compounds with hydroxyamines and then etherifying N—OH.

Sulfinic Acid Salts:

These compounds can reductively produce an active radical. Specific examples thereof include sodium arylsulfinate.

(c) Compound which Reacts with Radical to Convert it into Highly Active Radical or which Acts as Chain Transfer Agent:

As for the compound which reacts with a radical to convert it into a highly active radical or which acts as a chain transfer agent, for example, compounds having SH, PH, SiH or GeH within the molecule can be used. These compounds can produce a radical by donating hydrogen to a low-activity radical species or produce a radical through oxidation and then deprotonation. Specific examples thereof include 2-mercaptobenzimidazoles.

With respect to more specific examples of such co-sensitizers, many compounds are described, for example, in JP-A-9-236913 as an additive used for the purpose of enhancing the sensitivity. These co-sensitizers may be used individually or in combination of two or more thereof. The amount of the co-sensitizer used is suitably from 0.05 to 100 parts by mass, preferably from 1 to 80 parts by mass, more preferably from 3 to 50 parts by mass, per 100 parts by mass of the polymerizable compound.

<Formation of Image Recording Layer>

The image recording layer of the present invention is formed by dispersing or dissolving the necessary components described above in a solvent to prepare a coating solution and coating the obtained coating solution. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyl lactone, toluene and water. These solvents are used individually or in combination. The solid content concentration in the coating solution is preferably from 1 to 50 mass %.

The image recording layer of the present invention may also be formed by dispersing or dissolving the same or different components described above in the same or different solvents to prepare a plurality of coating solutions and repeating the coating and drying multiple times.

The coated amount (solid content) of the image recording layer obtained on the support after coating and drying varies depending on the usage but, in general, is preferably from 0.3 to 3.0 g/m$^2$. Within this range, good sensitivity and good film properties of the image recording layer can be obtained.

For the coating, various methods may be used and examples thereof include bar coater coating, rotary coating, spray coating, curtain coating, dip coating, air knife coating, blade coating and roll coating.

[Support]

The support for use in the lithographic printing plate precursor of the present invention is not particularly limited and may be sufficient if it is a dimensionally stable plate-like hydrophilic support. Examples thereof include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with the above-described metal. Among these supports, polyester film and aluminum plate are preferred, and aluminum plate is more preferred because this is dimensionally stable and relatively inexpensive.

The aluminum plate is a pure aluminum plate, an alloy plate mainly comprising aluminum and containing trace heteroelements, or an aluminum or aluminum alloy thin film laminated with a plastic. Examples of the heteroelement contained in the aluminum alloy include silicon, iron, manganese, copper, magnesium, chromium, zinc, bismuth, nickel and titanium. The heteroelement content in the alloy is preferably 10 mass % or less. In the present invention, a pure aluminum plate is preferred, but perfectly pure aluminum is difficult to produce in view of refining technique and therefore, an aluminum plate containing trace heteroelements may be used. The aluminum plate is not particularly limited in its composition, and a conventionally known and commonly employed material can be appropriately used.

The thickness of the support is preferably from 0.1 to 0.6 mm, more preferably from 0.15 to 0.4 mm, still more preferably from 0.2 to 0.3 mm.

In advance of using the aluminum plate, the aluminum plate is preferably subjected to a surface treatment such as surface roughening and anodization. This surface treatment facilitates enhancing hydrophilicity and ensuring adhesion between the image recording layer and the support. Before surface-roughening the aluminum plate, a degreasing treatment for removing the rolling oil on the surface is performed, if desired, by using a surfactant, an organic solvent, an alkaline aqueous solution or the like.

The surface-roughening treatment of the aluminum plate surface is performed by various methods and examples thereof include a mechanical surface-roughening treatment, an electrochemical surface-roughening treatment (a surface-roughening treatment of electrochemically dissolving the surface) and a chemical surface-roughening treatment (a surface-roughening treatment of chemically and selectively dissolving the surface).

The mechanical surface-roughening treatment may be performed by using a known method such as ball polishing, brush polishing, blast polishing and buff polishing.

The method for the electrochemical surface-roughening treatment includes, for example, a method of passing an alternating or direct current in an electrolytic solution containing an acid such as hydrochloric acid or nitric acid. Also, a method using a mixed acid described in JP-A-54-63902 may be used.

The surface-roughened aluminum plate is, if desired, subjected to an alkali etching treatment using an aqueous solution of potassium hydroxide, sodium hydroxide or the like and after a neutralization treatment, further subjected to an anodization treatment, if desired, so as to enhance the abrasion resistance.

As for the electrolyte for use in the anodization treatment of the aluminum plate, various electrolytes of forming a porous oxide film may be used. In general, a sulfuric acid, a hydrochloric acid, an oxalic acid, a chromic acid or a mixed acid thereof is used. The electrolyte concentration is appropriately determined according to the kind of the electrolyte.

The anodization treatment conditions vary depending on the electrolyte used and therefore, cannot be indiscriminately specified, but in general, the conditions are preferably such that the electrolyte concentration is from 1 to 80 mass %, the liquid temperature is from 5 to 70° C., the current density is from 5 to 60 A/dm$^2$, the voltage is from 1 to 100 V, and the electrolysis time is from 10 seconds to 5 minutes. The amount of the anodic oxide film formed is preferably from 1.0 to 5.0 g/m$^2$, more preferably from 1.5 to 4.0 g/m$^2$. Within this range, good press life and good scratch resistance in the non-image area of the lithographic printing plate can be obtained.

As for the support used in the present invention, the substrate having thereon an anodic oxide film after the above-described surface treatment may be used as-is, but in order to more improve adhesion to the upper layer, hydrophilicity, antiscumming property, heat insulation and the like, treatments described in JP-A-2001-253181 and JP-A-2001-322365, such as treatment for enlarging micropores of the anodic oxide film, treatment for pore-sealing micropores and surface-hydrophilizing treatment of dipping the substrate in an aqueous solution containing a hydrophilic compound, may be appropriately selected and applied. Of course, the enlarging treatment and pore-sealing treatment are not limited to those described in these patent publications and any conventionally known method may be employed.

The pore-sealing treatment may be a pore-sealing treatment with steam, a pore-sealing treatment with fluorinated zirconic acid alone, a pore-sealing treatment with an aqueous solution containing an inorganic fluorine compound, such as treatment with sodium fluoride, a pore-sealing treatment with steam having added thereto lithium chloride, or a pore-sealing treatment with hot water.

In particular, a pore-sealing treatment with an aqueous solution containing an inorganic fluorine compound, a pore-sealing treatment with water vapor, and a pore-sealing treatment with hot water are preferred.

As for the hydrophilization treatment, an alkali metal silicate method described in U.S. Pat. Nos. 2,714,066, 3,181,461, 3,280,734 and 3,902,734 is known. In this method, the support is dipped in an aqueous solution of sodium silicate or the like, or electrolyzed. Other examples include a method of treating the support with potassium fluorozirconate described in JP-B-36-22063, and a method of treating the support with polyvinylphosphonic acid described in U.S. Pat. Nos. 3,276,868, 4,153,461 and 4,689,272.

In the case where a support insufficient in the hydrophilicity on the surface, such as polyester film, is used as the support of the present invention, a hydrophilic layer is preferably coated to render the surface hydrophilic. The hydrophilic layer is preferably a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer having an organic hydrophilic matrix obtained by crosslinking or pseudo-crosslinking an organic hydrophilic polymer described in JP-A-2002-79772, a hydrophilic layer having an inorganic hydrophilic matrix obtained by sol-gel conversion comprising hydrolysis and condensation reaction of polyalkoxysilane, titanate, zirconate or aluminate, or a hydrophilic layer comprising an inorganic thin film having a metal oxide-containing surface. Among these, a hydrophilic layer formed by coating a coating solution containing a colloid of an oxide or hydroxide of silicon is more preferred.

In the case of using polyester film or the like as the support of the present invention, an antistatic layer is preferably provided on the hydrophilic layer side or opposite side of the support or on both sides. When an antistatic layer is provided between the support and the hydrophilic layer, this contributes to the enhancement of adhesion to the hydrophilic layer. Examples of the antistatic layer which can be used include a polymer layer having dispersed therein metal oxide fine particle or matting agent described in JP-A-2002-79772.

The support preferably has a center line average roughness of 0.10 to 1.2 μm. Within this range, good adhesion to the image recording layer, good press life and good antiscumming property can be obtained.

The color density of the support is preferably from 0.15 to 0.65 in terms of the reflection density value. Within this range, good image-forming property by virtue of antihalation at the image exposure and good suitability for plate inspection after development can be obtained.

[Undercoat Layer]

In the lithographic printing plate precursor of the present invention, an undercoat layer comprising a compound having a polymerizable group is preferably provided on the support. When an undercoat layer is used, the image recording layer is provided on the undercoat layer. The undercoat layer has an effect of strengthening, in the exposed area, adhesion between the support and the image recording layer and, in the unexposed area, facilitating the separation of image recording layer from the support, thereby enhancing the developability.

Specific suitable examples of the undercoat layer include a silane coupling agent having an addition-polymerizable ethylenic double bond reactive group described in JP-A-10-282679, and a phosphorus compound having an ethylenic double bond reactive group described in JP-A-2-304441. A particularly preferred compound is a compound having a polymerizable group such as methacryl group and allyl group, and a support-adsorbing group such as sulfonic acid group, phosphoric acid group and phosphoric acid ester. Also, a compound having a hydrophilicity-imparting group such as ethylene oxide group, in addition to the polymerizable group and the support-adsorbing group, can be suitably used.

The coated amount (solid content) of the undercoat layer is preferably from 0.1 to 100 mg/m$^2$, more preferably from 1 to 30 mg/M$^2$.

[Backcoat Layer]

After the support is subjected to a surface treatment or the undercoat layer is formed, a backcoat may be provided on the back surface of the support, if desired.

Suitable examples of the backcoat include a coat layer comprising an organic polymer compound described in JP-A-5-45885 and a coat layer comprising a metal oxide obtained by hydrolyzing and polycondensing an organic or inorganic metal compound described in JP-A-6-35174. Among these, those using an alkoxy compound of silicon, such as $Si(OCH_3)_4$, $Si(OC_2H_5)_4$, $Si(OC_3H_7)_4$ and $Si(OC_4H_9)_4$, are preferred because the raw material is inexpensive and easily available.

2. Plate-Making Method

The method for producing a lithographic printing plate of the present invention is characterized in that after imagewise exposure, the plate surface is rubbed by a rubbing member in the presence of a developer at a pH of 2 to 10 to remove the protective layer and the image recording layer in the unexposed area.

The developer for use in the present invention is a non-alkaline aqueous solution at a pH of 2 to 10. For example, water alone or an aqueous solution mainly comprising water (containing water at a ratio of 60 mass % or more) is preferred. In particular, an aqueous solution having the same composition as a generally known fountain solution, or an aqueous solution containing a surfactant (e.g., anionic, nonionic, cationic) is preferred. The pH of the developer is preferably from 3 to 9, more preferably from 4 to 8.

Examples of the anionic surfactant for use in the present invention include fatty acid salts, abietates, hydroxyalkanesulfonates, alkanesulfonates, dialkylsulfosuccinates, linear alkylbenzenesulfonates, branched alkylbenzenesulfonates, alkylnaphthalenesulfonates, alkylphenoxypolyoxyethylenepropylsulfonates, polyoxyethylenealkylsulfophenyl ether salts, N-methyl-N-oleyltaurine sodium salts, monoamide disodium N-alkylsulfosuccinates, petroleum sulfonates, sulfated castor oil, sulfated beef tallow oil, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene-maleic anhydride copolymerization products, partially saponified olefin-maleic anhydride copolymerization products, and naphthalenesulfonate formalin condensates. Among these, preferred are dialkylsulfosuccinates, alkylsulfuric ester salts and alkylnaphthalenesulfonates.

The cationic surfactant for use in the present invention is not particularly limited and a conventionally known cationic surfactant can be used. Examples thereof include alkylamine salts, quaternary ammonium salts, polyoxyethylenealkylamine salts and polyethylene polyamine derivatives.

Examples of the nonionic surfactant for use in the present invention include a polyethylene glycol-type higher alcohol ethylene oxide adduct, an alkylphenol ethylene oxide adduct, a fatty acid ethylene oxide adduct, a polyhydric alcohol fatty acid ester ethylene oxide adduct, a higher alkylamine ethylene oxide adduct, a fatty amide ethylene oxide adduct, an ethylene oxide adduct of fat and oil, a polypropylene glycol ethylene oxide adduct, a dimethylsiloxane-ethylene oxide block copolymer, a dimethylsiloxane-(propylene oxide-ethylene oxide) block copolymer, a fatty acid ester of polyhydric alcohol-type glycerol, a fatty acid ester of pentaerythritol, a fatty acid ester of sorbitol and sorbitan, a fatty acid ester of sucrose, an alkyl ether of polyhydric alcohol, and a fatty amide of alkanolamines.

One of these nonionic surfactants may be used alone or two or more thereof may be mixed and used. In the present invention, an ethylene oxide adduct of sorbitol and/or sorbitan fatty acid ester, a polypropylene glycol ethylene oxide adduct, a dimethylsiloxane-ethylene oxide block copolymer, a dimethylsiloxane-(propylene oxide-ethylene oxide) block copolymer, and a fatty acid ester of polyhydric alcohol are more preferred.

In view of stable solubility in water or turbidity, the HLB (hydrophile-lipophile balance) value of the nonionic surfactant for use in the developer of the present invention is preferably 6 or more, more preferably 8 or more. Furthermore, the ratio of the nonionic surfactant contained in the developer is preferably from 0.01 to 10 mass %, more preferably from 0.01 to 5 mass %.

Furthermore, an acetylene glycol-based or acetylene alcohol-based oxyethylene adduct, or a fluorine-containing or silicon-containing surfactant can also be similarly used.

In view of bubble suppression, the surfactant for use in the present invention is preferably a nonionic surfactant.

The developer for use in the present invention may contain an organic solvent. Examples of the organic solvent which can be contained include aliphatic hydrocarbons (e.g., hexane, heptane, "Isopar E, H, G" (produced by ESSO Kagaku K.K.), gasoline, kerosene), aromatic hydrocarbons (e.g., toluene, xylene), halogenated hydrocarbons (e.g., methylene dichloride, ethylene dichloride, trichlene, monochlorobenzene), and a polar solvent.

Examples of the polar solvent include alcohols (e.g., methanol, ethanol, propanol, isopropanol, benzyl alcohol, ethylene glycol monomethyl ether, 2-ethoxyethanol, diethylene glycol mono ethyl ether, diethylene glycol monohexyl ether, triethylene glycol mono methyl ether, propylene glycol monoethyl ether, dipropylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenyl carbinol, n-amyl alcohol, methylamyl alcohol), ketones (e.g., acetone, methyl ethyl ketone, ethyl butyl ketone, methyl isobutyl ketone, cyclohexanone), esters (e.g., ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate), and others (e.g., triethyl phosphate, tricresyl phosphate, N-phenylethanolamine, N-phenyldiethanolamine).

When the organic solvent is insoluble in water, the organic solvent may be solubilized in water by using a surfactant or the like and then used. In the case of using an organic solvent in the developer, in view of safety and flammability, the solvent concentration is preferably less than 40 mass %.

The developer of the present invention may contain a water soluble polymer and examples thereof include soybean polysaccharides, denatured starch, gum arabic, dextrin, a cellulose derivative (e.g., carboxymethyl cellulose, carboxyethyl cellulose, methyl cellulose) and a denatured product thereof, pullulan, polyvinyl alcohol and a derivative thereof, polyvinylpyrrolidone, a polyacrylamide or acrylamide copolymer, a vinyl methyl ether/maleic anhydride copolymer, a vinyl acetate/maleic anhydride copolymer, and a styrene/maleic anhydride copolymer.

As for the soybean polysaccharides, known compounds may be used. For example, Soyafive (trade name, produced by Fuji Oil Co., Ltd.) is commercially available and those in various grades can be used, but a product of giving an aqueous 10 mass % solution having a viscosity of 10 to 100 mPa/sec is preferred.

The denatured starch can also be a known compound and may be produced, for example, by a method where a starch such as corn, potato, tapioca, rice and wheat is decomposed with an acid, an enzyme or the like in the range of a glucose residue number of 5 to 30 per molecule, and an oxypropylene is further added in an alkali.

The water-soluble polymer compounds can also be used in combination of two or more thereof The content of the water-soluble polymer compound in the developer is preferably from 0.1 to 20 mass %, more preferably from 0.5 to 10 mass %.

In addition to these components, the developer for use in the present invention may contain an antiseptic, a chelating compound, a defoaming agent, an organic acid, an inorganic acid, an inorganic salt and the like.

Examples of the antiseptic which can be preferably used include phenol and a derivative thereof, formalin, an imidazole derivative, sodium dehydroacetate, a 4-isothiazolin-3-one derivative, benzisothiazolin-3-one, a benzotriazole derivative, an amidine guanidine derivative, quaternary ammonium salts, a derivative of pyridine, quinoline or guanidine, a derivative of diazine or triazole, a derivative of oxazole or oxazine, and an nitrobromoalcohol-based compound such as 2-bromo-2-nitropropane-1,3-diol, 1,1-dibromo-1-nitro-2-ethanol and 1,1-dibromo-1-nitro-2-propanol.

Examples of the chelating compound include organic phosphonic acids and phosphonoalkanetricarboxylic acids, such as ethylenediaminetetraacetic acid, and potassium and sodium salts thereof; diethylenetriaminepentaacetic acid, and potassium and sodium salts thereof; triethylenetetraminehexaacetic acid, and potassium and sodium salts thereof; hydroxyethylethylenediaminetriacetic acid, and potassium and sodium salts thereof; nitrilotriacetic acid and a sodium salt thereof; 1-hydroxyethane-1,1-diphosphonic acid, and potassium and sodium salts thereof; and aminotri(methylenephosphonic acid), and potassium and sodium salts thereof. In place of the sodium or potassium salt of these chelating agents, an organic amine salt is also effective.

As for the defoaming agent, a silicon-based self-emulsifying or emulsifying surfactant in general or a nonionic compound having an HLB of 5 or less may be used. A silicon defoaming agent is preferred and this defoaming agent may be any type such as emulsion-dispersing type or solubilizing type.

Examples of the organic acid include a citric acid, an acetic acid, an oxalic acid, a malonic acid, a salicylic acid, a caprylic acid, a tartaric acid, a malic acid, a lactic acid, a levulinic acid, a p-toluenesulfonic acid, a xylenesulfonic acid, a phytic acid and an organic phosphonic acid. The organic acid may be used in the form of its alkali metal salt or ammonium salt.

Examples of the inorganic acid and inorganic salt include a phosphoric acid, a metaphosphoric acid, an ammonium primary phosphate, an ammonium secondary phosphate, a sodium primary phosphate, a sodium secondary phosphate, a potassium primary phosphate, a potassium secondary phosphate, a sodium tripolyphosphate, a potassium pyrophosphate, a sodium hexametaphosphate, a magnesium nitrate, a sodium nitrate, a potassium nitrate, an ammonium nitrate, a sodium sulfate, a potassium sulfate, an ammonium sulfate, a sodium sulfite, an ammonium sulfite, a sodium bisulfate and a nickel sulfate.

In the present invention, the development processing can be suitably performed by an automatic processor equipped with developer supply means and a rubbing member. Examples of the automatic processor include an automatic processor described in JP-A-2-220061 and JP-A-60-59351, in which the rubbing treatment is performed while transporting the lithographic printing plate precursor after image recording; and an automatic processor described in U.S. Pat. Nos. 5,148,746 and 5,568,768 and British Patent 2,297,719, in which the lithographic printing plate precursor after image recording is set on a cylinder and then rubbed while rotating the cylinder. Among these, an automatic processor using a rotating brush roller as the rubbing member is preferred.

The rotating brush roller which can be preferably used in the present invention can be appropriately selected by taking account of, for example, scratch resistance of the image area and nerve strength of the support of the lithographic printing plate precursor.

As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is gaplessly radially wound around a plastic or metal roller working out to a core, can be used.

As for the brush material, a plastic fiber (for example, a polyester-based synthetic fiber such as polyethylene terephthalate and polybutylene terephthalate; a polyamide-based synthetic fiber such as nylon 6.6 and nylon 6.10); a polyacrylic synthetic fiber such as polyacrylonitrile and alkyl poly(meth)acrylate; and a polyolefin-based synthetic fiber such as polypropylene and polystyrene) can be used. For example, a brush material having a fiber bristle diameter of 20 to 400 μm and a bristle length of 5 to 30 mm can be suitably used.

The outer diameter of the rotating brush roller is preferably from 30 to 200 mm, and the peripheral velocity at the tip of the brush rubbing the plate surface is preferably from 0.1 to 5 m/sec.

The rotary direction of the rotating brush roller for use in the present invention may be the same direction or the opposite direction with respect to the conveying direction of the lithographic printing plate precursor of the present invention, but when two or more rotating brush rollers are used as in an automatic processor shown in FIG. 1, it is preferred that at least one rotating brush roller rotates in the same direction and at least one rotating brush roller rotates in the opposite direction. By such rotation, the thermosensitive layer in the non-image area can be more unfailingly removed. Furthermore, a technique of rocking the rotating brush roller in the rotation axis direction of the brush roller is also effective.

The developer may be used at an arbitrary temperature, but the developer temperature is preferably from 10 to 50° C.

In the present invention, the lithographic printing plate after the rubbing treatment may be subsequently subjected to water washing, drying and desensitization. In the desensitization treatment, a known desensitizing solution can be used.

In advance of the above-described development processing, the lithographic printing plate precursor is exposed through a transparent original having a line image, a halftone image or the like, or imagewise exposed, for example, by the scanning of laser light based on digital data. Examples of the light source suitable for the exposure include a carbon arc lamp, a mercury lamp, a xenon lamp, a metal halide lamp, a strobe, an ultraviolet ray, an infrared ray and a laser beam. In particular, a laser beam is preferred. Examples of the laser include a solid or semiconductor laser of emitting infrared ray at 760 to 1,200 nm, an ultraviolet semiconductor laser of emitting light at 250 to 420 nm, an argon ion laser of emitting visible light, and an FD-YAG laser. Among these, in view of simplification of plate-making, lasers of emitting an infrared or ultraviolet ray to allow for working under white light or yellow light are preferred.

As for the infrared laser, the output is preferably 100 mW or more, the exposure time is preferably 20μ seconds or less per one picture element, and the amount of energy irradiated is preferably from 10 to 300 mJ/cm$^2$. As for the semiconductor laser of emitting light of 250 to 420 nm, the output is preferably 0.1 mW or more. Whichever laser is employed, a multi-beam laser device is preferably used so as to shorten the exposure time.

3. On-Press Developable Lithographic Printing Plate Precursor

Out of the constituent elements of the on-press developable lithographic printing plate precursor, the support, the undercoat layer and the backcoat layer can be formed by appropriately selecting the components and methods described with respect to the lithographic printing plate precursor for processing by an automatic developing machine.

The protective layer and the image recording layer are described below.

[Protective Layer]

The protective layer of the on-press developable lithographic printing plate precursor of the present invention contains, as an essential component, a polyvinyl alcohol having a carboxyl group and/or a sulfonic acid group within the molecule. In the following, this polyvinyl alcohol is sometimes referred to as an "acid-modified polyvinyl alcohol".

The acid-modified polyvinyl alcohol for use in the present invention is not specifically limited as long as it is a polyvinyl alcohol having a carboxyl group and/or a sulfonic acid group within the molecule, but for example, a polyvinyl alcohol obtained by copolymerizing a vinyl ester-based monomer (as represented by vinyl acetate) with an ethylenically unsaturated group-containing compound (such as acrylic acid, methacrylic acid, phthalic acid, phthalic anhydride, maleic acid, maleic anhydride, itaconic acid, itaconic anhydride, 2-acrylamide-2-methyl-1-propanesulfonic acid, allylsulfonic acid, methallylsulfonic acid, vinylsulfonic acid, and a salt thereof), and saponifying the resultant copolymer, or a polyvinyl alcohol obtained by radical-polymerizing the above-described ethylenically unsaturated carboxylic acid and/or ethylenically unsaturated sulfonic acid in the presence of a polyvinyl alcohol-based polymer having a thiol group at the terminal, may be suitably used.

Examples of the vinyl ester-based monomer which can be used include vinyl formate, vinyl propionate, vinyl versatate and vinyl pivalate, other than vinyl acetate.

The acid-modified polyvinyl alcohol for use in the present invention can be copolymerized with a copolymerizable ethylenically unsaturated monomer within the range of not impairing the effect of the present invention. Examples of such an ethylenically unsaturated monomer include ethylene, isobutylene, acrylonitrile, methacrylonitrile, acrylamide, methacrylamide, trimethyl-(3-acrylamide-3-dimethylpropyl)ammonium chloride, ethylvinyl ether, butylvinyl ether, N-vinylpyrrolidone, vinyl chloride, vinyl bromide, vinyl fluoride, vinylidene chloride, vinylidene fluoride and tetrafluoroethylene.

As for the acid-modified polyvinyl alcohol for use in the present invention, a terminal-modified product obtained by copolymerizing a vinyl ester-based monomer (e.g., vinyl acetate) with an ethylenically unsaturated carboxylic acid in the presence of a thiol compound (e.g., thiolacetic acid, mercaptopropionic acid), and saponifying the resultant copolymer, may also be used.

The polymerization degree of the acid-modified polyvinyl alcohol for use in the present invention is not particularly limited but is preferably from 50 to 3,000, more preferably from 100 to 2,000. The saponification degree is also not specifically limited but is preferably from 70 to 100 mol %, more preferably from 80 to 98 mol %. Furthermore, the modifying amount of the carboxyl group and/or sulfonic acid group is also not particularly limited but is preferably from 0.1 to 50 mol %, more preferably 0.5 to 10 mol %, still more preferably from 3 to 8 mol %.

Another useful example of the acid-modified polyvinyl alcohol for use in the present invention is a reaction product of a polyvinyl alcohol (PVA)-based polymer with a modifying agent. The reaction of a PVA-based polymer with a modifying agent is classified into various groups by the chemical bonding form. Representative examples of the bonding include acetal bonding and ester bonding.

The introduction of a modifying agent by acetal bonding may be achieved by using a modifying agent having an aldehyde or an acetal thereof within the molecule and causing an acetalation reaction of a PVA-based polymer with the modifying agent.

Examples of the modifying agent which is introduced into a PVA-based polymer by utilizing acetal bonding include a 2-formylacetic acid and a metal salt or ammonium salt thereof, a 3-formylpropionic acid and a metal salt or ammonium salt thereof, a 5-formylpentanoic acid and a metal salt or ammonium salt thereof, a 4-formylphenoxyacetic acid and a metal salt or ammonium salt thereof, a 2-carboxybenzaldehyde and a metal salt or ammonium salt thereof, a 4-carboxybenzaldehyde and a metal salt or ammonium salt thereof, a 2,4-dicarboxybenzaldehyde and a metal salt or ammonium salt thereof, a benzaldehyde-2-sulfonic acid and a metal salt or ammonium salt thereof, a benzaldehyde-2,4-disulfonic acid and a metal salt or ammonium salt thereof, a 4-formylphenoxysulfonic acid and a metal salt or ammonium salt thereof, a 3-formyl-1-propanesulfonic acid and a metal salt or ammonium salt thereof, and a 7-formyl-1-heptanesulfonic acid and a metal salt or ammonium salt thereof.

The introduction of a modifying agent by ester bonding is achieved by using a modifier having a carboxyl group, an ester group or an acid anhydride skeleton within the molecule and causing an esterification reaction of a PVA-based polymer with the modifying agent. Usually, the esterification reaction proceeds with a catalyst of either acid or base. In the case of using an acid anhydride, the reaction proceeds even without a catalyst.

Examples of the modifying agent introduced into a PVA-based polymer by ester bonding include an acid anhydride such as maleic anhydride, succinic anhydride, phthalic anhydride, 1,2-cyclohexanedicarboxylic anhydride, 1,2-cyclohexenedicarboxylic anhydride, norbomanedicarboxylic anhydride, norbornenedicarboxylic anhydride, trimellitic anhydride, pyromellitic anhydride and diphenic anhydride; an acid such as formic acid, acetic acid, propionic acid, mercaptopropionic acid, benzoic acid, acrylic acid, methacrylic acid, maleic acid, fumaric acid, succinic acid and phthalic acid; and an ester thereof selected from methyl, ethyl, propyl, butyl, phenyl and benzyl.

In this way, various modifying agents can be introduced into a PVA-based polymer by acetal bonding or ester bonding. Among these, acetal bonding is most excellent in that the modifying agent having a functional group over a wide range can be introduced into PVA with a high reaction ratio, and the modifying agent is preferably an aldehyde or an acetal thereof.

The introduction ratio of the modifying agent based on the PVA-based polymer can be arbitrarily controlled by selecting the reaction conditions but is usually from 0.01 to 20 mol % and in view of imparting clear functionality to the resultant modified PVA, preferably 0.5 mol % or more, more preferably from 3 to 8 mol %.

The protective layer of the present invention preferably further contains the above-descried inorganic layered compound. The content of the inorganic layered compound in the protective layer is preferably from 5/1 to 1/100 in terms of the mass ratio to the acid-modified polyvinyl alcohol. Also in the case of using a plurality of inorganic layered compounds in combination, the total amount of these inorganic layered compounds preferably accounts for a mass ratio within the above-described range. Furthermore, the protective layer of the present invention may contain, if desired, other additives described above with respect to the protective layer of the lithographic printing plate precursor for non-alkaline development processing.

The protective layer for use in the present invention may be formed in the same manner as in the lithographic printing plate precursor for processing by an automatic developing machine.

The coated amount of the protective layer is, in terms of the coated amount after drying, preferably from 0.01 to 10 g/m², more preferably from 0.02 to 3 g/m², and most preferably from 0.02 to 1 g/m².

[Image Recording Layer]

In the on-press development type lithographic printing plate precursor, the image recording layer removable by a printing ink and/or a fountain solution is, in view of sensitivity, on-press developability and press life, preferably an image recording layer which is polymerized and cured by the effect of light and/or heat and in which a polymerization initiator and a polymerizable compound are contained as image recording elements.

The polymerization initiator, polymerizable compound, ultraviolet absorbent and sensitizing dye which can used in such an image recording layer can be appropriately selected from the compounds described above with respect to the lithographic printing plate precursor for processing by an automatic developing machine.

In this image recording layer, a binder polymer may be used for increasing the film property such as film strength of the layer or enhancing the on-press developability. As for the binder polymer, conventionally known binder polymers can be used without limitation and a linear organic polymer having film property is preferred. Examples of such a binder polymer include a (meth)acrylic resin, a polyvinyl acetal resin, a polyurethane resin, a polyurea resin, a polyimide resin, a polyamide resin, an epoxy resin, a polystyrene-based resin, a novolak-type phenol-based resin, a polyester resin, a synthetic rubber and a natural rubber.

Among these, a (meth)acrylic resin, namely, a polymer of (meth)acrylic acid ester is preferred. In particular, a (meth)acrylic acid ester copolymer containing a monomer unit having a —CH₂CH₂O— structure in the R moiety of —COOR in the (meth)acrylic acid ester is preferred. Specific examples thereof are set forth below, but the present invention is not limited thereto.

(1):

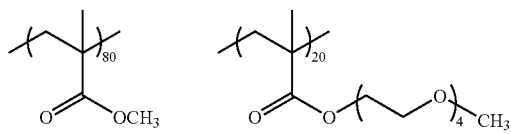

(2):

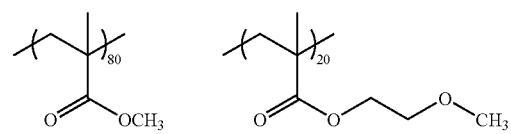

(3):

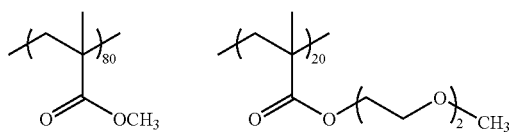

(4):

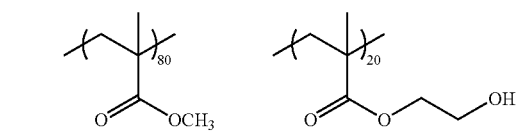

(5):

(6):

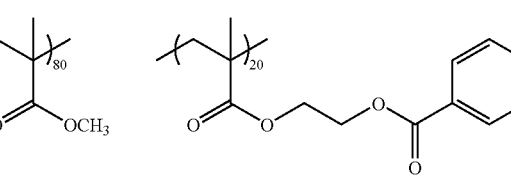

The polymer binder preferably has a crosslinking property so as to enhance the film strength in the image area. The crosslinking property may be imparted to the polymer binder by introducing a crosslinking functional group such as ethylenically unsaturated bond into the main or side chain of the polymer. The crosslinking functional group may also be introduced by copolymerization.

Examples of the polymer having an ethylenically unsaturated bond in the molecular main chain include poly-1,4-butadiene and poly-1,4-isoprene.

Examples of the polymer having an ethylenically unsaturated bond in the molecular side chain include a polymer which is a polymer of acrylic or methacrylic acid ester or amide and in which the ester or amide residue (R in —COOR' or —CONHR') described above with respect to the hydrophobic binder polymer has an ethylenically unsaturated bond. The content of the crosslinking group in the binder polymer is preferably in the above-described range.

In view of the on-press developability of the image recording layer in the exposed area, the binder polymer preferably has high solubility or dispersibility in the ink and/or fountain solution.

In order to enhance the solubility or dispersibility in the ink, the binder polymer is preferably lipophilic, whereas in order to enhance the solubility or dispersibility in the fountain solution, the binder polymer is preferably hydrophilic. Therefore, use of a lipophilic binder polymer and a hydrophilic binder polymer in combination is also effective in the present invention.

Specific examples of the hydrophilic binder polymer include hydrophilic polymers described above.

The binder polymers may be used individually or in combination of two or more thereof. The binder polymer content is preferably from 10 to 90 mass %, more preferably from 20 to 80 mass %, still more preferably from 30 to 70 mass %, based on the entire solid content of the image recording layer. Within this range, good strength of image area and good image-forming property can be obtained.

The polymerizable compound and the binder polymer are preferably used in amounts of giving a mass ratio of 1/9 to 7/3.

The image recording layer may further contain other additives. Specific examples of other additives include the compounds such as surfactant, colorant and printing-out agent described above with respect to the lithographic printing plate precursor for processing by an automatic developing machine.

Also in the image recording layer, the components of the image recording layer can be incorporated by enclosing these components in a microcapsule or a microgel. It is also possible to enclose some of the components in a microcapsule or a microgel and incorporate the remaining outside the microcapsule or microgel by arbitrarily setting the ratio of the components enclosed in the microcapsule or microgel to the components incorporated outside the microcapsule or microgel.

The on-press development type image recording layer of the present invention preferably contains a microcapsule or microgel enclosing at least one of the above-described infrared absorbent, sensitizer, polymerization initiator and polymerizable compound. When the image recording layer contains a microcapsule or a microgel, the on-press developability is enhanced.

Examples of the method for enclosing the image recording layer-constituting components into a microcapsule or a microgel are the same as those described above for the method in the case of a lithographic printing plate precursor for automatic development processing.

This image recording layer is, similarly to the lithographic printing plate precursor for processing by an automatic developing machine, obtained by coating the coating solution on a support and drying it. The coated amount (solid content) of the image recording layer varies depending on the usage but, in general, is preferably from 0.3 to 3.0 g/m$^2$. Within this range, good sensitivity and good film properties of the image recording layer can be obtained.

4. Lithographic Printing Method

In the lithographic printing method of the present invention, printing is performed by supplying a printing ink and a fountain solution without passing through any development processing step after imagewise exposure. Specific examples thereof include a method of exposing the lithographic printing plate precursor with a laser, then loading it on a printing press without passing through a development processing step, and performing printing; and a method of loading the lithographic printing plate precursor on a printing press, exposing it with a laser on the printing press, and performing printing without passing through a development processing step.

The light source for the imagewise exposure is appropriately selected from examples of the light source described with respect to the plate-making method using an automatic developing machine. Among these, a laser of emitting light at any one wavelength in the range from 760 to 1,200 nm, and a laser of emitting light at any one wavelength in the range from 250 to 420 nm, are preferred in view of handleability in a bright room.

When the lithographic printing plate precursor is imagewise exposed with a laser and then printing is performed by supplying a printing ink and a fountain solution without passing through a development processing step such as wet development, the image recording layer cured by the exposure forms a printing ink-receiving part with a lipophilic surface in the exposed area of the image recording layer. On the other hand, in the unexposed area, the uncured image recording layer is removed by dissolving or dispersing in the supplied fountain solution or printing ink or in both thereof and the hydrophilic surface is revealed in this portion.

As a result, the fountain solution adheres to the revealed hydrophilic surface and the printing ink adheres to the image recording layer in the exposed region, thereby initiating the printing. Here, either a fountain solution or a printing ink may be first supplied to the plate surface, but a printing ink is preferably first supplied so that the fountain solution can be prevented from contamination by the image recording layer in the unexposed area.

In this way, the lithographic printing plate precursor is on-press developed on an off-set printing press and used as-is for printing a large number of sheets.

EXAMPLES

The present invention is described in greater detail below by referring to Examples, but the present invention should not be construed as being limited thereto.

1. Preparation of Support

A 0.3 mm-thick aluminum plate (construction material: 1050) was degreased with an aqueous 10 mass % sodium aluminate solution at 50° C. for 30 seconds to remove the rolling oil on the surface. Thereafter, the aluminum plate surface was grained by using three nylon brushes implanted with bundled bristles having a diameter of 0.3 mm and a water suspension (specific gravity: 1.1 g/cm$^3$) of pumice having a median diameter of 25 μm, and then thoroughly washed with water. This plate was etched by dipping it in an aqueous 25 mass % sodium hydroxide solution at 45° C. for 9 seconds and after washing with water, dipped in 20 mass % nitric acid at 60° C. for 20 seconds, followed by washing with water. At this time, the etched amount of the grained surface was about 3 g/m$^2$.

Subsequently, the aluminum plate was subjected to a continuous electrochemical surface-roughening treatment by using AC voltage at 60 Hz. The electrolytic solution used here was an aqueous 1 mass % nitric acid solution (containing 0.5 mass % of aluminum ion) at a liquid temperature of 50° C. This electrochemical surface-roughening treatment was performed by using an AC power source of giving a rectangular wave AC having a trapezoidal waveform such that the time TP necessary for the current value to reach the peak from zero was 0.8 msec and the duty ratio was 1:1, and disposing a carbon electrode as the counter electrode. The auxiliary anode was ferrite. The current density was 30 A/dm² in terms of the peak value of current, and 5% of the current flowing from the power source was split to the auxiliary anode. The quantity of electricity at the nitric acid electrolysis was 175 C/dm² when the aluminum plate was serving as the anode. Thereafter, the aluminum plate was water-washed by spraying.

Thereafter, the aluminum plate was subjected to an electrochemical surface-roughening treatment in the same manner as in the nitric acid electrolysis above by using, as the electrolytic solution, an aqueous 0.5 mass % hydrochloric acid solution (containing 0.5 mass % of aluminum ion) at a liquid temperature of 50° C. under the conditions that the quantity of electricity was 50 C/dm² when the aluminum plate was serving as the anode, and then water-washed by spraying. This plate was treated in 15 mass % sulfuric acid (containing 0.5 mass % of aluminum ion) as the electrolytic solution at a current density of 15 A/dm² to provide a DC anodic oxide film of 2.5 g/m², then washed with water and dried.

The center line average roughness (Ra) of the thus-obtained support was measured by using a needle having a diameter of 2 μm and found to be 0.51 μm.

Furthermore, the following Undercoat Solution (1) was coated to have a dry coated amount of 10 mg/M². In this way, a support with an undercoat layer for use in the tests later was produced.

| <Undercoat Solution (1)> | |
|---|---|
| Undercoat Compound (1) | 0.017 g |
| Methanol | 9.00 g |
| Water | 1.00 g |

Undercoat Compound (1):

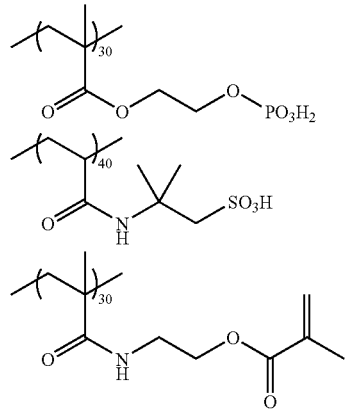

2. Production of Lithographic Printing Plate Precursor For Processing by Automatic Developing Machine

[Production of Lithographic Printing Plate Precursor (1)]

On the support with an undercoat layer prepared above, Coating Solution (1) for Image Recording Layer having the following composition was bar-coated and then dried in an oven at 100° C. for 60 seconds to form an image recording layer having a dry coated amount of 1.4 g/m². On this image recording layer, Coating Solution (1) for Protective Layer having the following composition was coated by using a bar to give a dry coated amount of 1.0 g/m² and then dried at 120° C. for 1 minute to obtain Lithographic Printing Plate Precursor (1).

| <Coating Solution (1) for Image Recording Layer> | |
|---|---|
| Binder Polymer (1) shown below | 2.0 g |
| Polymerizable compound: | 1.4 g |
| isocyanuric acid EO-modified triacrylate (Aronics M-315, produced by Toa Gosei Co., Ltd.) | |
| Polymerizable compound: | 0.1 g |
| ethoxylated trimethylolpropane triacrylate (SR9035, produced by Nippon Kayaku Co., Ltd., EO addition molar number: 15, molecular weight: 1,000) | |
| Sensitizing Dye (1) shown below | 0.15 g |
| Polymerization Initiator (1) shown below | 0.20 g |
| Co-Sensitizer (1) | 0.4 g |
| Ethyl Violet | 0.1 g |
| Thermopolymerization inhibitor | 0.1 g |
| N-nitrosophenylhydroxylamine aluminum salt | |
| Water-Soluble Fluorine-Containing Surfactant (1) | 0.02 g |
| Tetraethylamine hydrochloride | 0.06 g |
| 1-Methoxy-2-propanol | 17.5 g |
| Methyl ethyl ketone | 19.0 g |

Binder Polymer (1):

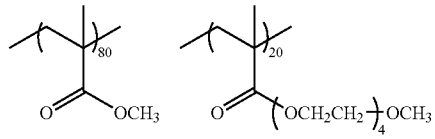

Sensitizing Dye (1):

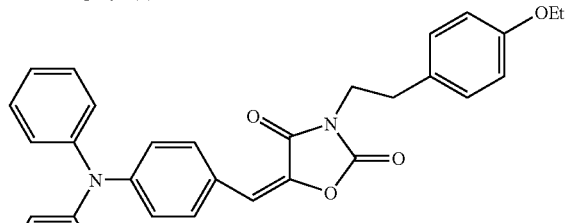

Polymerization Initiator (1):

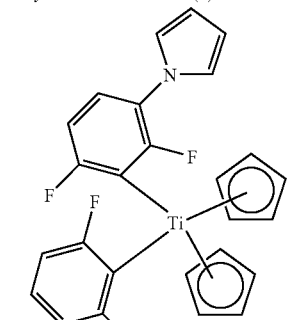

Co-Sensitizer (1):

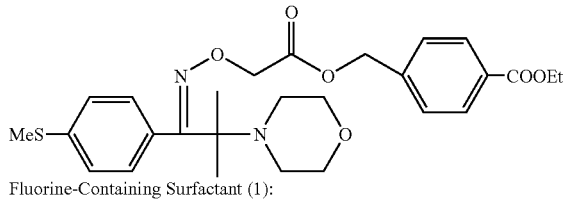

Fluorine-Containing Surfactant (1):

-continued

<Coating Solution (1) for Image Recording Layer>

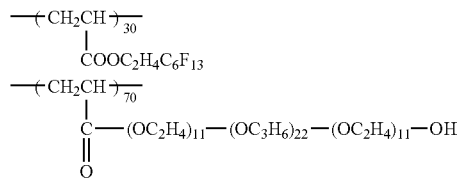

Coating Solution (1) for Protective Layer:
Mica Liquid Dispersion (1) shown below 13.0 g
Polyvinyl alcohol (saponification degree: 98.5 mol %) 1.3 g
(PVA110, produced by Kuraray Co., Ltd.)
Sodium 2-ethylhexylsulfosuccinate 0.3 g
Water 133 g (Preparation of Mica Liquid Dispersion (1))

In 368 g of water, 32 g of synthetic mica ("SOMASIF ME-100", produced by CO-OP Chemical Co., Ltd., aspect ratio: 1,000 or more) was added and dispersed by using a homogenizer until the average particle diameter (laser scattering method) became 0.5 μm to obtain Mica Liquid Dispersion (1).

[Production of Lithographic Printing Plate Precursor (2) (for Comparative Example)]

Lithographic Printing Plate Precursor (2) was obtained in the same manner as in Production of Lithographic Printing Plate Precursor (1) except for not providing the protective layer.

[Production of Lithographic Printing Plate Precursors (3) to (5)]

Lithographic Printing Plate Precursors (3), (4) and (5) were obtained in the same manner as in Production of Lithographic Printing Plate Precursor (1) except for chanting the coated amount of the protective layer to 0.48 g/m², 0.24 g/m² and 0.12 g/m², respectively.

[Production of Lithographic Printing Plate Precursors (6) to (8)]

Lithographic Printing Plate Precursors (6), (7) and (8) were obtained in the same manner as in Production of Lithographic Printing Plate Precursor (3) except that Coating Solution (1) for Protective Layer was changed in the amount added of Mica Dispersion Solution (1) to 30 g, 8 g and 0 g, respectively, and coated to give a protective layer coated amount of 0.48 g/m².

[Production of Lithographic Printing Plate Precursor (9)]

Lithographic Printing Plate Precursor (9) was obtained in the same manner as in Production of Lithographic Printing Plate Precursor (3) except for changing the coating solution for protective layer to Coating Solution (2) for Protective Layer having the following composition.

<Coating Solution (2) for Protective Layer>

Modified polyvinyl alcohol (KL-318, produced by Kuraray 0.6 g
Co., Ltd., saponification degree: 88 mol%, polymerization
degree: 1,800)
Nonionic Surfactant (1) shown below 0.06 g
Mica Liquid Dispersion (1) 10 g
Water 150 g Nonionic Surfactant (1):

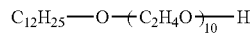

[Production of Lithographic Printing Plate Precursor (10)]

On the support with an undercoat layer prepared above, Coating Solution (2) for Image Recording Layer having the following composition was bar-coated and then dried in an oven at 70° C. for 60 seconds to form an image recording layer having a dry coated weight of 1.0 g/m². On this image recording layer, Coating Solution (1) for Protective Layer was coated to give a dry coated weight of 0.35 g/m² and then dried at 120° C. for 1 minute to obtain Lithographic Printing Plate Precursor (10).

<Coating Solution (2) for Image Recording Layer>

Polymerization Initiator (2) shown below 0.2 g
Sensitizing Dye (2) shown below 0.1 g
Binder Polymer (2) shown below (average molecular weight: 6.0 g
80,000)
Polymerizable compound: 12.4 g
isocyanuric acid EO-modified triacrylate (Aronics M-
315, produced by Toa Gosei Co., Ltd.)
Leuco Crystal Violet 0.5 g
Tetraethylamine hydrochloride 0.1 g
Fluorine-Containing Surfactant (1) 0.1 g
Methyl ethyl ketone 70.0 g Polymerization Initiator (2)

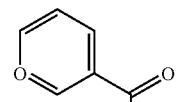

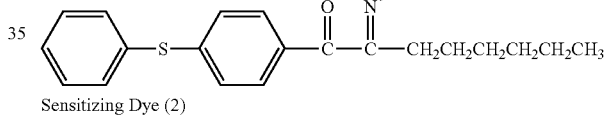

Sensitizing Dye (2)

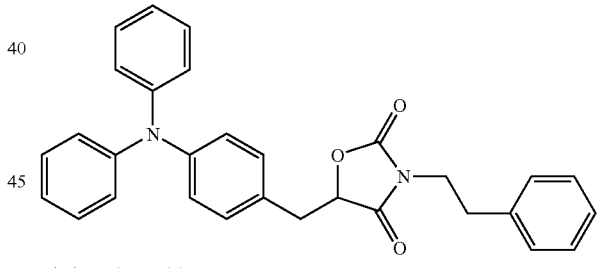

Binder Polymer (2):

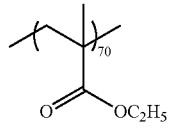

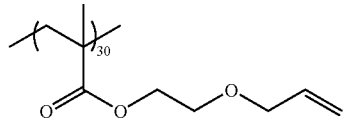

[Production of Lithographic Printing Plate Precursor (11)]

Lithographic Printing Plate Precursor (11) was obtained in the same manner as in Production of Lithographic Printing Plate Precursor (10) except for changing Coating Solution (2) for Image Recording Layer to Coating Solution (3) for Image Recording Layer having the following composition.

| <Coating Solution (3) for Image Recording Layer> | |
| --- | --- |
| Polymerization Initiator (2) | 0.2 g |
| Sensitizing Dye (2) | 0.1 g |
| Binder Polymer (2) (average molecular weight: 80,000) | 3.0 g |
| Polymerizable compound: isocyanuric acid EO-modified diacrylate (Aronics M-215, produced by Toa Gosei Co., Ltd.) | 6.2 g |
| Leuco Crystal Violet | 0.2 g |
| Fluorine-Containing Surfactant (1) | 0.1 g |
| Microcapsule (1) shown below (as solid content) | 10.0 g |
| Methyl ethyl ketone | 35.0 g |
| 1-Methoxy-2-propanol | 35.0 g |
| Water | 10.0 g |

(Synthesis of Microcapsule (1))

As the oil phase component, 10 g of trimethylolpropane and xylene diisocyanate adduct (Takenate D-110N, produced by Mitsui Takeda Chemicals, Inc.), 4.15 g of isocyanuric acid EO-modified diacrylate (Aronics M-215, produced by Toa Gosei Co., Ltd.) and 0.1 g of Pionin A-41C (produced by Takemoto Oil & Fat Co., Ltd.) were dissolved in 17 g of ethyl acetate. As the aqueous phase component, 40 g of an aqueous 4 mass % PVA-205 solution was prepared. The oil phase component and the aqueous phase component were mixed and emulsified by using a homogenizer at 12,000 rpm for 10 minutes. The resulting emulsified product was added to 25 g of distilled water and the mixture was stirred at room temperature for 30 minutes and then stirred at 40° C. for 3 hours. The thus-obtained Microcapsule Solution (1) was diluted with distilled water to a solid content concentration of 20 mass %. The average particle diameter was 0.25 μm.

[Production of Lithographic Printing Plate Precursor (12)]

Lithographic Printing Plate Precursor (12) was obtained in the same manner as Lithographic Printing Plate Precursor (10) except for changing Sensitizing Dye (2) in Coating Solution (2) for Image Recording Layer to Sensitizing Dye (3) shown below.

Sensitizing Dye (3):

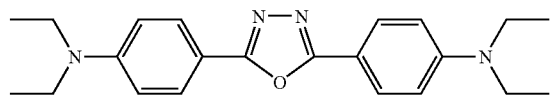

[Production of Lithographic Printing Plate Precursor (13)]

Lithographic Printing Plate Precursor (13) was obtained in the same manner as Lithographic Printing Plate Precursor (11) except for changing Sensitizing Dye (2) in Coating Solution (3) for Image Recording Layer to Sensitizing Dye (3).

[Production of Lithographic Printing Plate Precursor (14)]

Lithographic Printing Plate Precursor (14) was obtained in the same manner as in Production of Lithographic Printing Plate Precursor (10) except for changing Polymerization Initiator (2) in Coating Solution (2) for Image Recording Layer to Polymerization Initiator (3) shown below.

Polymerization Initiator (3):

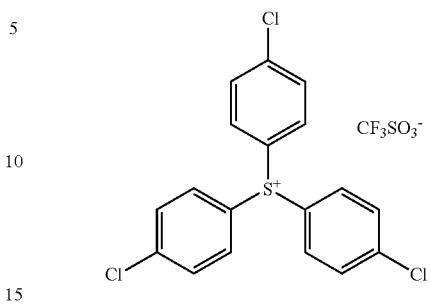

[Production of Lithographic Printing Plate Precursor (15)]

Lithographic Printing Plate Precursor (15) was obtained in the same manner as Lithographic Printing Plate Precursor (10) except that Polymerization Initiator (2) in Coating Solution (2) for Image Recording Layer was changed to Polymerization Initiator (4) shown below and Sensitizing Dye (2) was not added.

Polymerization Initiator (4):

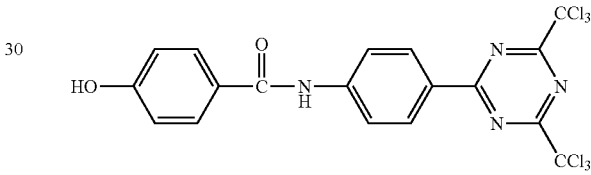

[Production of Lithographic Printing Plate Precursor (16)]

On the support with an undercoat layer prepared above, Coating Solution (4) for Image Recording Layer having the following composition was bar-coated and then dried in an oven at 70° C. for 60 seconds to form an image recording layer having a dry coated weight of 1.0 g/m². On this image recording layer, Coating Solution (2) for Protective Layer was coated to give a dry coated weight of 0.4 g/m² and then dried at 120° C. for 1 minute to obtain Lithographic Printing Plate Precursor (16).

| <Coating Solution (4) for Image Recording Layer> | |
| --- | --- |
| Infrared Absorbent (1) shown below | 0.05 g |
| Polymerization Initiator (5) shown below | 0.20 g |
| Binder Polymer (1) | 0.50 g |
| Polymerizable compound: isocyanuric acid EO-modified diacrylate (Aronics M-215, produced by Toa Gosei Co., Ltd.) | 1.00 g |
| Naphthalenesulfonate of Victoria Pure Blue | 0.02 g |
| Fluorine-Containing Surfactant (1) | 0.10 g |
| Methyl ethyl ketone | 18.0 g |

-continued

<Coating Solution (4) for Image Recording Layer>

Infrared Absorbent (1)

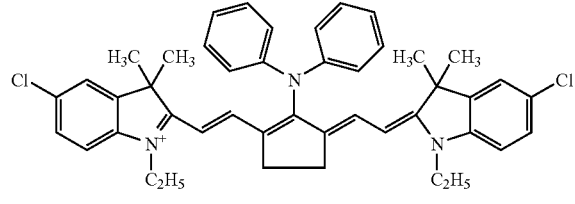

Polymerization Initiator (1):

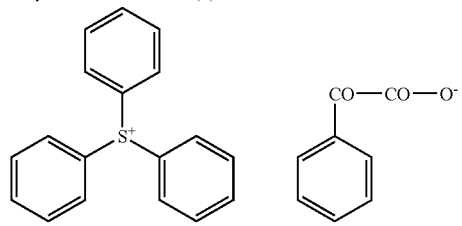

[Production of Lithographic Printing Plate Precursor (17)]

Lithographic Printing Plate Precursor (17) was obtained in the same manner as Lithographic Printing Plate Precursor (16) except for changing Coating Solution (4) for Image Recording Layer to Coating Solution (5) for Image Recording Layer shown below.

<Coating Solution (5) for Image Recording Layer>

Coating Solution (5) for Image Recording Layer was obtained by mixing and stirring the following Photosensitive Solution (1) and Microcapsule Solution (2) immediately before coating.

| Photosensitive Solution (1): | |
|---|---|
| Binder Polymer (1) | 0.16 g |
| Polymerization Initiator (4) | 0.10 g |
| Infrared Adsorbent (1) | 0.02 g |
| Polymerizable monomer, Aronics M-215 (produced by Toa Gosei Co., Ltd.) | 0.38 g |
| Fluorine-Containing Surfactant (1) | 0.04 g |
| Methyl ethyl ketone | 1.09 g |
| 1-Methoxy-2-propanol | 8.60 g |
| Microcapsule Solution (2) | |
| Microcapsule (2) synthesized as follows | 2.64 g |
| Water | 2.42 g |

Synthesis of Microcapsule (2):

As the oil phase component, 10 g of trimethylolpropane and xylene diisocyanate adduct (Takenate D-110N, produced by Mitsui Takeda Chemicals, Inc.), 3.15 g of pentaerythritol triacrylate (SR444, produced by Nippon Kayaku Co., Ltd.), 0.35 g of Infrared Absorbent (2) shown below, 1 g of 3-(N, N-diethylamino)-6-methyl-7-anilinofluorane (ODB, produced by Yamamoto Chemicals, Inc.), and 0.1 g of Pionin A-41C (produced by Takemoto Yushi Co., Ltd.) were dissolved in 17 g of ethyl acetate. As the aqueous phase component, 40 g of an aqueous 4 mass % PVA-205 solution was prepared. The oil phase component and the aqueous phase component were mixed and emulsified by using a homogenizer at 12,000 rpm for 10 minutes. The resulting emulsified product was added to 25 g of distilled water, stirred at room temperature for 30 minutes and then stirred at 40° C. for 3 hours. The thus-obtained microcapsule solution was diluted with distilled water to a solid content concentration of 15 mass %. The average particle size was 0.2 μm.

[Production of Lithographic Printing Plate Precursor (17-1)]

Lithographic Printing Plate Precursor (17-1) was obtained in the same manner as in Production of Lithographic Printing Plate Precursor (3) except that Polymerization Initiator (1) and Co-Sensitizer (1) in the Coating Solution (1) for Image Recording Layer were changed to Polymerization Initiator (6) and Co-Sensitizer (2) shown below.

Polymerization Initiator (6):

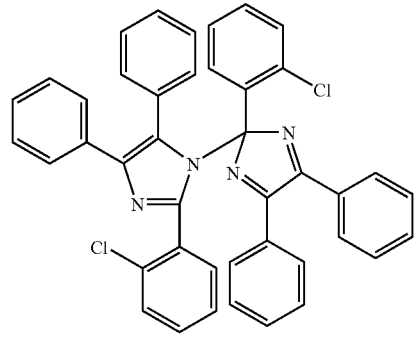

Co-Sensitizer (2):

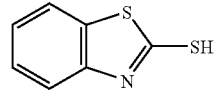

[Production of Lithographic Printing Plate Precursor (17-2)]

Lithographic Printing Plate Precursor (17-2) was obtained in the same manner as in Production of Lithographic Printing Plate Precursor (11) except for changing Microcapsule (1) to Microgel (1) prepared below.

(Synthesis of Microgel (1))

As the oil phase component, 10 g of a trimethylolpropane and xylene diisocyanate adduct (Takenate D-110N, produced by Mitsui Takeda Chemicals, Inc.), 3.15 g of pentaerythritol triacrylate (SR444, produced by Nippon Kayaku Co., Ltd.) and 0.1 g of Pionin A-41C (produced by Takemoto Oil & Fat Co., Ltd.) were dissolved in 17 g of ethyl acetate. As the aqueous phase component, 40 g of an aqueous 4 mass % PVA-205 solution was prepared. The oil phase component and the aqueous phase component were mixed and emulsified by using a homogenizer at 12,000 rpm for 10 minutes. The resulting emulsified product was added to 25 g of distilled water and the mixture was stirred at room temperature for 30 minutes and then stirred at 50° C. for 3 hours. The thusobtained microgel solution was diluted with distilled water to a solid content concentration of 15 mass %. The average particle diameter was 0.2 μm. -

3. Examples of Production Method of Lithographic Printing Plate

Examples 1 to 7 and Comparative Example 1

(1) Exposure, Development and Printing

Lithographic Printing Plate Precursors (1) to (8) produced above each was imagewise exposed with use of a semiconductor laser of 405 nm at an output of 10 mW by changing the energy density.

Thereafter, the development processing was performed in an automatic development processor having a structure shown in FIG. 1 by using Developer (1) having the following composition. The pH of the developer was about 5. The automatic development processor was an automatic processor having two rotating brush rollers. As for the rotating brush rollers used, the first brush roller was a brush roller having an outer diameter of 90 nm and being implanted with a polybutylene terephthalate-made fiber (bristle diameter: 200 μm, bristle length: 17 mm), and this brush roller was rotated at 200 rpm in the same direction as the conveying direction (peripheral velocity at the tip of brush: 0.94 m/sec). The second brush roller was a brush roller having an outer diameter and being implanted with a polybutylene terephthalate-made fiber (bristle diameter: 200 μm, bristle length: 17 mm), and this brush roller was rotated at 200 rpm in the direction opposite the conveying direction (peripheral velocity at the tip of brush: 0.63 m/sec). The lithographic printing plate precursor was conveyed at a conveying speed of 100 cm/min.

The developer was supplied to the plate surface by showering from a spray pipe with use of a circulating pump. The tank volume for developer was 10 liter.

| Developer (1) | |
|---|---|
| Water | 100 g |
| Benzyl alcohol | 1 g |
| Polyoxyethylene sorbitan monooleate (HLB = 10.0) | 1 g |
| Sodium salt of dioctylsulfosuccinic acid ester | 0.5 g |
| Gum arabic | 1 g |
| Ethylene glycol | 0.5 g |
| Ammonium primary phosphate | 0.05 g |
| Citric acid | 0.05 g |
| Tetrasodium salt of ethylenediaminetetraacetate | 0.05 g |

The lithographic printing plate after development was loaded on a printing press, SOR-M, manufactured by Heidelberg, and printing was performed at a printing speed of 6,000 sheets per hour by using a fountain solution (EU-3 (etching solution, produced by Fuji Photo Film Co., Ltd.))/water/isopropyl alcohol=1/89/10 (by volume)) and TRANS-G(N) black ink (produced by Dai-Nippon Ink & Chemicals, Inc.).

(2) Evaluation

Using the lithographic printing plate precursors produced above, the sensitivity, scratch resistance and development processability were evaluated as follows.

<Sensitivity>

After performing printing on 100 sheets as described above and confirming that a printed matter free of ink staining in the non-image area was obtained, 500 sheets were continuously printed. Thus, 600 sheets in total were printed. The exposure amount of causing no unevenness in the ink density of the image area on the 600th printed matter was measured and defined as the sensitivity.

<Scratch Resistance>

In the evaluation of the protective layer strength, the protective layer was scratched by a scratching tester with a sapphire needle having a radius of 4.0 mmϕ under a load of 200 g, laser exposure was then performed with an exposure amount determined in the evaluation of sensitivity above, and printing was performed. At this time, whether a normal printed image could be formed was evaluated. In the case where the protective layer strength was insufficient, scratches were generated on the protective layer to deteriorate the oxygen blocking property or the image recording layer was shaved off together with the protective layer to render the image forming property defective in the scratched portion. The rating was ○ for normal image formation, □ for image formation in the allowable level, and x for defective image formation.

<Processability>

At the time of development-processing 500 m² of each lithographic printing plate precursor in an automatic development processor, generation of scum adhering to the tank wall of the automatic developing machine was observed. The scum generated is mainly attributable to the binder of the protective layer. The rating was ○ for no scum generation, □ for scum generation in the allowable level, and x for serious scum generation.

The evaluation results are shown in Table 1.

TABLE 1

Examples 1 to 7 and Comparative Example 1

| Example | Lithographic Printing Plate Precursor | Coated Amount of Protective Layer, g/m² | Mica Content in Protective Layer, mass % | Sensitivity, mJ/cm² | Scratch Resistance | Processability |
|---|---|---|---|---|---|---|
| Example 1 | (1) | 1.0 | 39.4 | 0.05 | ○ | □ |
| Comparative Example 1 | (2) | 0 | 39.4 | 2.5 | x | ○ |
| Example 2 | (3) | 0.48 | 39.4 | 0.07 | ○ | ○ |
| Example 3 | (4) | 0.24 | 39.4 | 0.08 | ○ | ○ |
| Example 4 | (5) | 0.12 | 39.4 | 0.09 | □ | ○ |
| Example 5 | (6) | 0.48 | 60.0 | 0.05 | ○ | ○ |
| Example 6 | (7) | 0.48 | 28.6 | 0.08 | ○ | ○ |
| Example 7 | (8) | 0.48 | 0 | 0.10 | □ | □ |

Examples 8 to 10

Lithographic Printing Plate Precursors (9), (10) and (11) were subjected to image exposure, development processing and printing in the same manner as in Example 1. The evaluation results are shown in Table 2.

Examples 11 to 14

Lithographic Printing Plate Precursors (12) to (15) each was imagewise exposed with use of a semiconductor laser of 375 nm at an output of 10 mW by changing the energy density.

Except for this imagewise exposure, the development processing and printing were performed in the same manner as in Example 1. The evaluation results are shown in Table 2.

Examples 15 and 16

Lithographic Printing Plate precursors (16) and (17) each was imagewise exposed with use of Trendsetter 3244VX (manufactured by Creo) having mounted thereon a water-cooling 40 W infrared (830 nm) semiconductor laser by changing the energy density.

Except for this imagewise exposure, the development processing and printing were performed in the same manner as in Example 1. The evaluation results are shown in Table 2.

TABLE 2

| | | Examples 8 to 16 | | | |
|---|---|---|---|---|---|
| Example | Lithographic Printing Plate Precursor | Wavelength of Exposure Laser, nm | Sensitivity, $mJ/cm^2$ | Scratch Resistance | Processability |
| Example 8 | (9) | 405 | 0.05 | ○ | ○ |
| Example 9 | (10) | 405 | 0.07 | ○ | ○ |
| Example 10 | (11) | 405 | 0.07 | ○ | ○ |
| Example 11 | (12) | 375 | 0.05 | ○ | ○ |
| Example 12 | (13) | 375 | 0.06 | ○ | ○ |
| Example 13 | (14) | 375 | 0.08 | ○ | ○ |
| Example 14 | (15) | 375 | 0.07 | ○ | ○ |
| Example 15 | (16) | 830 | 75 | ○ | ○ |
| Example 16 | (17) | 830 | 90 | ○ | ○ |

Example 17

The image exposure, development processing and printing were performed in the same manner as in Example 2 except that polyoxyethylene sorbitan monooleate (HLB=10.0) of Developer (1) was changed to an anionic surfactant having a structural formula shown below and 0.1 g of a defoaming agent, FS Antifoam DR110N (produced by Dow Corning, silicone-based emulsion), was added. As a result, the same evaluation results as in Example 2 were obtained.

Anionic Surfactant:

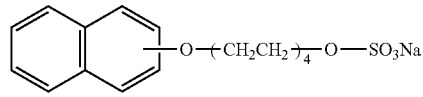

Example 17-1

Lithographic Printing Plate Precursor (17-1) was subjected to image exposure, development processing and printing in the same manner as in Example 2.

The wavelength of the exposure laser was 405 nm, the sensitivity was 0.07 $mJ/cm^2$, the scratch resistance was ○, and the processability was ○.

Example 17-2

Lithographic Printing Plate Precursor (17-1) was subjected to image exposure, development processing and printing in the same manner as in Example 17.

The wavelength of the exposure laser was 405 nm, the sensitivity was 0.07 $mJ/cm^2$, the scratch resistance was ○, and the processability was ○.

Example 17-3

Lithographic Printing Plate Precursor (17-2) was subjected to image exposure, development processing and printing in the same manner as in Example 10.

The wavelength of the exposure laser was 405 nm, the sensitivity was 0.07 $mJ/cm^2$, the scratch resistance was ○, and the processability was ○.

4. Production of On-Press Development Type Lithographic Printing Plate Precursor

Examples 18 to 27

On the support with an undercoat layer obtained above in Preparation of Support, Coating Solution (6) for Image Recording Layer having the following composition was bar-coated and then dried in an oven at 100° C. for 60 seconds to form an image recording layer having a dry coated amount of 1.0 $g/m^2$.

Coating Solution (6) for Image Recording Layer was obtained by mixing and stirring the following Photosensitive Solution (2) and Microcapsule Solution (3) immediately before coating.

| <Photosensitive Solution (1)> | |
|---|---|
| Binder Polymer (1) | 0.162 g |
| Polymerization Initiator (5) | 0.100 g |
| Infrared Adsorbent (1) | 0.020 g |
| Polymerizable compound, Aronics M-215 (produced by Toa Gosei Co., Ltd.) | 0.385 g |
| Fluorine-Containing Surfactant (1) | 0.044 g |
| Methyl ethyl ketone | 1.091 g |
| 1-Methoxy-2-propanol | 8.609 g |
| Microcapsule Solution (2) | |
| Microcapsule (3) synthesized as follows | 2.640 g |
| Water | 2.425 g |

Polymerization Initiator (5):

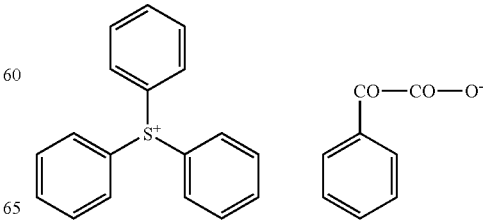

<Synthesis of Microcapsule (3)>

As the oil phase component, 10 g of trimethylolpropane and xylene diisocyanate adduct (Takenate D-110N, produced by Mitsui Takeda Chemicals, Inc.), 6.00 g of Aronics M-215 (produced by Toa Gosei Co., Ltd.) and 0.12 g of Pionin A-41C (produced by Takemoto Yushi Co., Ltd.) were dissolved in 16.67 g of ethyl acetate. As the aqueous phase component, 37.5 g of an aqueous 4 mass % polyvinyl alcohol (PVA-205, produced by Kuraray Co., Ltd.) solution was prepared. The oil phase component and the aqueous phase component were mixed and emulsified by using a homogenizer at 12,000 rpm for 10 minutes. The resulting emulsified product was added to 25 g of distilled water, stirred at room temperature for 30 minutes and then stirred at 40° C. for 2 hours. The thus-obtained microcapsule solution was diluted with distilled water to a solid content concentration of 15 mass %. The average particle size was 0.2 μm.

On the thus-formed image recording layer, Coating Solution (3) for Protective Layer having the following composition was coated to give a dry coated weight of 0.2 g/m$^2$ and then dried at 120° C. for 1 minute. In this way, Lithographic Printing Plate Precursors (18) to (27) were obtained.

<Coating Solution (3) for Protective Layer>

| | |
|---|---|
| Acid-modified polyvinyl alcohol (prepared by saponifying the vinyl acetate copolymer which was obtained by the copolymerization at the ratio show in Table 3; polymerization degree and saponification degree are also shown in Table 3) | 60 g |
| Nonionic Surfactant (1) | 6 g |
| Inorganic compound water dispersion prepared below | 1,000 g |
| Water | 15,000 g |

<Preparation of Inorganic Compound Water Dispersion>

In 360 g of water, 40 g of synthetic mica ("SOMASIF ME-100", produced by CO-OP Chemical Co., Ltd.) was added and dispersed by using a homogenizer until the average particle diameter became 2.0 μm to prepare an inorganic compound water dispersion.

TABLE 3

Acid-Modified Polyvinyl Alcohols Used in Examples 18 to 27

| | Species of Copolymerized Monomers | | | Copolymerization Ratio (mol %) | | | Polymerization Degree | Saponification Degree (mol %) |
|---|---|---|---|---|---|---|---|---|
| Example | A | B | C | A | B | C | | |
| Example 18 | itaconic acid | vinyl acetate | — | 2 | 98 | — | 1700 | 88 |
| Example 19 | maleic acid | vinyl acetate | — | 8 | 92 | — | 500 | 88 |
| Example 20 | maleic acid | vinyl acetate | — | 2.5 | 97.5 | — | 500 | 88 |
| Example 21 | maleic anhydride | vinyl acetate | — | 3 | 97 | — | 500 | 95 |
| Example 22 | sodium 2-acrylamide-2-methyl-1-propanesulfonate | vinyl acetate | — | 2.5 | 97.5 | — | 1700 | 88 |
| Example 23 | sodium 2-acrylamide-2-methyl-1-propanesulfonate | vinyl acetate | — | 3 | 97 | — | 500 | 88 |
| Example 24 | sodium allylsulfonate | vinyl acetate | — | 1.5 | 98.5 | — | 500 | 98 |
| Example 25 | sodium N-sulfo-isobutyleneacrylamide | vinyl acetate | — | 1 | 99 | — | 1700 | 98 |
| Example 26 | sodium sulfopropyl-tridecylacrylamide | vinyl acetate | — | 1 | 99 | — | 500 | 98 |
| Example 27 | sodium 2-acrylamide-2-methyl-1-propanesulfonate | maleic acid | vinyl acetate | 2.5 | 2.5 | 95 | 500 | 88 |

Examples 28 to 34

Lithographic Printing Plate Precursors (28) to (34) were obtained in the same manner as in Example (18) except for changing Coating Solution (3) for Protective Layer to Coating Solution (4) for Protective Layer.

<Coating Solution (4) for Protective Layer>

| | |
|---|---|
| Acid-modified polyvinyl alcohol (prepared by modifying a polyvinyl alcohol (PVA) having an average polymerization degree of 500 and a saponification degree of 98 mol % by using the modifying agent and the modification ratio (mol %) shown in Table 4) | 60 g |
| Nonionic Surfactant (1) | 6 g |
| Inorganic compound water dispersion prepared above | 1,000 g |
| Water | 15,000 g |

TABLE 4

Acid-Modified Polyvinyl Alcohols Used in Examples 28 to 34

| Example | PVA | Modifying Agent | Modification, molar number |
|---|---|---|---|
| Example 28 | polymerization degree: 500, saponification degree: 98 mol % | 2-carboxy-benzaldehyde | 3 |
| Example 29 | polymerization degree: 500, saponification degree: 98 mol % | 4-carboxy-benzaldehyde | 3 |
| Example 30 | polymerization degree: 500, saponification degree: 98 mol % | sodium benzaldehyde-2-sulfonate | 3 |
| Example 31 | polymerization degree: 500, saponification degree: 98 mol % | sodium benzaldehyde-2,4-disulfonate | 3 |
| Example 32 | polymerization degree: 500, saponification degree: 98 mol % | maleic anhydride | 10 |
| Example 33 | polymerization degree: 500, saponification degree: 98 mol % | phthalic anhydride | 10 |
| Example 34 | polymerization degree: 500, saponification degree: 98 mol % | succinic anhydride | 10 |

Example 35

On the support with an undercoat layer prepared above, Coating Solution (7) for Image Recording Layer having the following composition was bar-coated and then dried in an oven at 100° C. for 60 seconds to form an image recording layer having a dry coated amount of 1.0 g/m². On this image recording layer, Coating Solution (3) for Protective Layer used in Example 23 was coated by using a bar to give a dry coated amount of 0.2 g/m² and then dried at 120° C. for 1 minute to obtain Lithographic Printing Plate Precursor (35).

<Coating Solution (7) for Image Recording Layer>

| | |
|---|---|
| Polymerization Initiator (4) | 0.2 g |
| Binder Polymer (1) | 12.0 g |
| Polymerizable compound: isocyanuric acid EO-modified triacrylate (Aronics M-315, produced by Toa Gosei Co., Ltd.) | 6.0 g |
| Ethylene oxide group-containing compound shown below | 1.5 g |
| Leuco Crystal Violet | 3.0 g |
| Thermopolymerization inhibitor N-nitrosophenylhydroxylamine aluminum salt | 0.1 g |
| Fluorine-Containing Surfactant (1) | 0.1 g |
| Methyl ethyl ketone | 70.0 g |

Ethylene Oxide Group-Containing Compound:

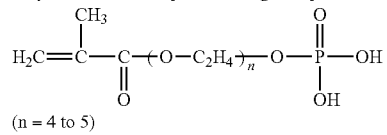

(n = 4 to 5)

Example 36

On the support with an undercoat layer prepared above, Coating Solution (8) for Image Recording Layer having the following composition was bar-coated and then dried in an oven at 100° C. for 60 seconds to form an image recording layer having a dry coated amount of 1.4 g/m². On this image recording layer, Coating Solution (3) for Protective Layer used in Example 23 was coated by using a bar to give a dry coated amount of 0.3 g/m² and then dried at 120° C. for 1 minute to obtain Lithographic Printing Plate Precursor (36).

<Coating Solution (8) for Image Recording Layer>

| | |
|---|---|
| Binder Polymer (1) | 2.0 g |
| Polymerizable compound: isocyanuric acid EO-modified triacrylate (Aronics M-315, produced by Toa Gosei Co., Ltd.) | 1.5 g |
| Sensitizing Dye (1) | 0.15 g |
| Polymerization Initiator (1) | 0.20 g |
| Co-Sensitizer (1) | 0.4 g |
| Ethyl Violet | 0.1 g |
| Thermopolymerization inhibitor N-nitrosophenylhydroxylamine aluminum salt | 0.1 g |
| Fluorine-Containing Surfactant (1) | 0.02 g |
| Tetraethylamine hydrochloride | 0.06 g |
| 1-Methoxy-2-propanol | 17.5 g |
| Methyl ethyl ketone | 19.0 g |

Comparative Example 2

Lithographic Printing Plate Precursor (37) for comparison was produced in the same manner as in Example 18 except for using a comparative coating solution for protective layer obtained by changing the acid-modified polyvinyl alcohol in Coating Solution (3) for Protective Layer to an unmodified polyvinyl alcohol (polymerization degree: 500, saponification degree: 88 mol %).

Comparative Example 2

Lithographic Printing Plate Precursor (38) for comparison was produced in the same manner as in Comparative Example 2 except for removing the inorganic compound water dispersion from the comparative coating solution for protective layer.

5. Exposure, Printing and Evaluation of On-Press Development Type Lithographic Printing Plate Precursor Lithographic Printing Plate Precursors (18) to (37) produced above each was exposed by using Trendsetter 3244VX (manufactured by Creo) having mounted thereon a water-cooling 40 W infrared semiconductor laser, under the conditions that the output was 9 W, the rotation number of outer drum was 210 rpm and the resolution was 2,400 dpi. Here, the exposure image was prepared to contain a fine line chart. Also, as for Lithographic Printing Plate Precursor (35), the imagewise exposure was performed by using a semiconductor laser of 375 nm at an output of 20 mW under the condition that the energy density was 3 mJ/cm². Furthermore, Lithographic Printing Plate Precursor (36) was imagewise exposed by using a semiconductor laser of 405 nm at an output of 10 mW under the condition that the energy density was 3 mJ/cm².

The resulting exposed lithographic printing plate was, without passing through development processing, loaded on a cylinder of a printing press, SOR-M, manufactured by Heidelberg, and after supplying a fountain solution and an ink by using a fountain solution (EU-3 (etching solution, produced by Fuji Photo Film Co., Ltd.))/water/isopropyl alcohol=1/89/10 (by volume)) and TRANS-G(N) black ink (produced by Dai-Nippon Ink & Chemicals, Inc.), 1,000 sheets were printed at a printing speed of 6,000 sheets per hour. With any of lithographic printing plates, a printed matter free from background staining was obtained until the 1,000th sheet was printed.

The lithographic printing plate precursors prepared above were evaluated on the on-press developability, inking property, fine line reproducibility, coatability and scratch resistance in the following manner. The evaluation results are shown in Table 5.

(1) On-Press Developability

The number of printing sheets required until the image recording layer in the unexposed part was removed with a printing ink and/or a fountain solution on the printing press and the ink was not transferred to the printing sheet was counted and evaluated as the on-press developability.

(2) Inking Property

After the initiation of printing, ink gradually attaches to the image recording layer and the ink concentration on paper increases. The number of sheets printed when the ink concentration reached to a standard printed matter concentration was counted and evaluated as the inking property.

(3) Fin Line Reproducibility

After printing 100 sheets and confirming that a printed matter free of ink staining in the non-image area was obtained, the fine line chart (chart obtained by exposure of fine lines of 10, 12, 14, 16, 18, 20, 25, 30, 35, 40, 60, 80, 100 and 200 μm) was observed by a magnifier at a magnification of 25 and the fine line reproducibility was evaluated by the width of a fine line which was reproduced by the ink without discontinuity.

Generally, in the case of a negative lithographic printing plate precursor, the cure degree of image recording layer decreases when the exposure amount is small, whereas the cure degree increases when the exposure amount is large. If the cure degree of the image recording layer is too low, this gives rise to defective reproducibility of small dot or fine line of the lithographic printing plate. On the other hand, when the cure degree of the image recording layer is high, good reproducibility of small dot or fine line is obtained. Therefore, the evaluation of fine line reproducibility under the same exposure amount condition can be used also as an index for the sensitivity of the negative lithographic printing plate. That is, as the fine line width in the fine line reproducibility is smaller, the sensitivity of the lithographic printing plate precursor is revealed to be higher.

(4) Coatability

In the case of containing an inorganic compound in the protective layer, the coated surface state sometimes becomes poor due to aggregation or the like of the inorganic compound. The surface state after coating and drying the protective layer was evaluated with an eye and rated ○ for good surface state and x for bad surface state.

(5) Scratch Resistance

In the evaluation of the protective layer strength, the protective layer was scratched by a scratching tester with a sapphire needle having a radius of 4.0 mmφ while changing the load, subsequently laser exposure and then printing were performed, and the maximum load when a normal image could be formed was measured. When the protective layer was scratched with an excessively large force, scratches are generated therein, oxygen blocking property becomes insufficient and the image forming property deteriorates. As the maximum load is larger, the film strength of the protective layer is higher and the scratch resistance is more excellent. In the evaluation shown in Table below, rating ○ is when a normal image was obtained under application of a load of 200 g, and rating x is for defective image formation.

TABLE 5

Evaluation Results of Examples and Comparative Examples

| Example | Lithographic Printing Plate Precursor | Inking Property | Coatability | On-Press Developability | Fine Line Reproducibility | Scratch Resistance |
|---|---|---|---|---|---|---|
| Example 18 | 18 | 100 sheets | ○ | 20 sheets | 10 μm | ○ |
| Example 19 | 19 | 30 sheets | ○ | 20 sheets | 10 μm | ○ |
| Example 20 | 20 | 50 sheets | ○ | 20 sheets | 10 μm | ○ |
| Example 21 | 21 | 50 sheets | ○ | 20 sheets | 10 μm | ○ |
| Example 22 | 22 | 100 sheets | ○ | 15 sheets | 10 μm | ○ |
| Example 23 | 23 | 50 sheets | ○ | 15 sheets | 10 μm | ○ |
| Example 24 | 24 | 100 sheets | ○ | 20 sheets | 10 μm | ○ |
| Example 25 | 25 | 100 sheets | ○ | 20 sheets | 10 μm | ○ |
| Example 26 | 26 | 100 sheets | ○ | 20 sheets | 10 μm | ○ |
| Example 27 | 27 | 20 sheets | ○ | 15 sheets | 10 μm | ○ |
| Example 28 | 28 | 70 sheets | ○ | 20 sheets | 10 μm | ○ |
| Example 29 | 29 | 70 sheets | ○ | 20 sheets | 10 μm | ○ |
| Example 30 | 30 | 70 sheets | ○ | 20 sheets | 10 μm | ○ |
| Example 31 | 31 | 50 sheets | ○ | 15 sheets | 10 μm | ○ |
| Example 32 | 32 | 100 sheets | ○ | 20 sheets | 10 μm | ○ |
| Example 33 | 33 | 100 sheets | ○ | 20 sheets | 10 μm | ○ |
| Example 34 | 34 | 100 sheets | ○ | 20 sheets | 10 μm | ○ |
| Example 35 | 35 | 50 sheets | ○ | 20 sheets | 10 μm | ○ |

TABLE 5-continued

Evaluation Results of Examples and Comparative Examples

| Example | Lithographic Printing Plate Precursor | Inking Property | Coatability | On-Press Developability | Fine Line Reproducibility | Scratch Resistance |
|---|---|---|---|---|---|---|
| Example 36 | 36 | 70 sheets | o | 20 sheets | 10 μm | o |
| Comparative Example 2 | 37 | 300 sheets | x | 30 sheets | 10 μm | x |
| Comparative Example 3 | 38 | 300 sheets | o | 50 sheets | 20 μm | o |

As seen from the results above, when a polyvinyl alcohol modified with a carboxylic acid and/or a sulfonic acid is used, the inking property is greatly improved and the scratch resistance, on-press developability and fine line reproducibility are good. Also, when an inorganic compound is used in combination, the coatability is enhanced.

Example 37

Lithographic Printing Plate Precursor (39) was obtained in the same manner as in Example 18 except for using Microgel (1) described in Lithographic Printing Plate Precursor (17-2) in place of Microcapsule (3), and evaluated in the same manner as in Example 18.

The inking property was 100 sheets, the coatability was o, the on-press developability was 20 sheets, the fine line reproducibility was 10 μm, and the scratch resistance was o.

This application is based on Japanese patent applications JP 2004-243889, filed on Aug. 24, 2004 and JP 2004-262529, filed on Sep. 9, 2004, the entire content of which is hereby incorporated by reference, the same as if set forth at length.

What is claimed is:

1. A lithographic printing plate precursor comprising a support, a radical polymerizable image recording layer and a protective layer in this order, wherein the radical polymerizable image recording layer is removable with a printing ink and/or a fountain solution, and the protective layer contains (1) a polyvinyl alcohol having a sulfonic acid group within the molecule, and (2) an inorganic layered compound, wherein said inorganic layered compound is a mica, and wherein said radical polymerizable image recording layer comprises a binder polymer containing a monomer unit represented by either one of the following formulae:

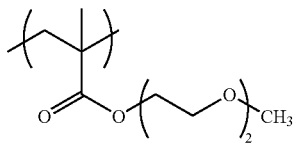

-continued

2. The lithographic printing plate precursor as claimed in claim 1, wherein the acid modification ratio of said polyvinyl alcohol is from 3 to 8%.

3. The lithographic printing plate precursor as claimed in claim 1, wherein the radical polymerizable image recording layer comprises a microcapsule or a microgel.

4. A lithographic printing method comprising:
   imagewise exposing the lithographic printing plate precursor claimed in claim 1 by the irradiation of an infrared ray at a wavelength of 760 to 1,200 nm;
   supplying a printing ink and a fountain solution to remove said radical polymerizable image recording layer in the portion unirradiated with the infrared ray; and
   performing printing.

5. A lithographic printing method comprising: imagewise exposing the lithographic printing plate precursor claimed in claim 1 by the irradiation of an ultraviolet ray at a wavelength of 250 to 420 nm; supplying a printing ink and a fountain solution to remove said radical polymerizable image recording layer in the portion unirradiated with the ultraviolet ray; and performing printing.

6. The lithographic printing plate precursor as claimed in claim 1, wherein the radical polymerizable image recording layer contains (1) a polymerization initiator, (2) a polymerizable compound and (3) said binder polymer.

7. The lithographic printing plate precursor as claimed in claim 1, wherein said binder polymer has an ethylenically unsaturated bond in a side chain.

* * * * *